United States Patent
Osada et al.

(10) Patent No.: US 9,378,988 B2
(45) Date of Patent: Jun. 28, 2016

(54) SUBSTRATE PROCESSING APPARATUS AND SUBSTRATE PROCESSING METHOD USING PROCESSING SOLUTION

(75) Inventors: Naoyuki Osada, Kyoto (JP); Kentaro Sugimoto, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 889 days.

(21) Appl. No.: 13/539,626

(22) Filed: Jul. 2, 2012

(65) Prior Publication Data

US 2013/0020284 A1    Jan. 24, 2013

(30) Foreign Application Priority Data

Jul. 20, 2011  (JP) ................. 2011-158697
Jul. 20, 2011  (JP) ................. 2011-158894
Jul. 20, 2011  (JP) ................. 2011-158896

(51) Int. Cl.
*B08B 3/02*    (2006.01)
*B08B 3/04*    (2006.01)
*B08B 9/023*   (2006.01)
*H01L 21/67*   (2006.01)

(52) U.S. Cl.
CPC .......... *H01L 21/67051* (2013.01); *B08B 3/022* (2013.01); *B08B 3/041* (2013.01); *B08B 9/023* (2013.01); *H01L 21/67028* (2013.01); *H01L 21/67034* (2013.01)

(58) Field of Classification Search
CPC ............. B08B 3/02; B08B 3/04; B08B 9/023
See application file for complete search history.

(56) References Cited

U.S. PATENT DOCUMENTS

| 5,487,398 A | 1/1996 | Ohmi et al. |
| 7,891,365 B2 | 2/2011 | Hirao et al. ................. 134/104.2 |
| 8,439,051 B2 | 5/2013 | Matsumoto |
| 2003/0168078 A1 | 9/2003 | Deguchi |

(Continued)

FOREIGN PATENT DOCUMENTS

| CN | 1444256 A | 9/2003 |
| CN | 101431006 A | 5/2009 |

(Continued)

OTHER PUBLICATIONS

Office Action dated Mar. 10, 2015 in corresponding Korean Patent Application No. 10-2014-0167312 with Japanese and English translations.

(Continued)

*Primary Examiner* — Michael Kornakov
*Assistant Examiner* — N. Campbell
(74) *Attorney, Agent, or Firm* — Ostrolenk Faber LLP

(57) ABSTRACT

Nozzle arms for holding discharge heads are caused by a pivotal driving part to move between a processing position above a substrate and a standby position outside a processing cup surrounding a substrate. When the nozzle arms having cleaned a substrate is placed at the standby position, a cleaning solution is ejected from a shower nozzle toward the nozzle arms arranged obliquely downward of the shower nozzle. The three nozzle arms are caused to move up and down such that the nozzle arms cut across a jet of a cleaning solution discharged obliquely downward, thereby cleaning the three nozzle arms in order. Then, a nitrogen gas is ejected from a drying gas nozzle and sprayed on the nozzle arms to remove the cleaning solution attached to the nozzle arms, thereby drying the nozzle arms.

4 Claims, 20 Drawing Sheets

(56) References Cited

U.S. PATENT DOCUMENTS

| | | | |
|---|---|---|---|
| 2004/0173153 A1 | 9/2004 | Muramatsu et al. | 118/715 |
| 2006/0086373 A1 | 4/2006 | Park | |
| 2007/0232073 A1 | 10/2007 | Oshima | |
| 2007/0256633 A1* | 11/2007 | Lin | H01L 21/6708 118/52 |
| 2008/0078428 A1 | 4/2008 | Yoshida | 134/104.2 |
| 2009/0114248 A1 | 5/2009 | Kim | |
| 2009/0114253 A1 | 5/2009 | Matsumoto | |
| 2010/0051059 A1 | 3/2010 | Kometani et al. | 134/21 |
| 2010/0126539 A1 | 5/2010 | Lee et al. | |
| 2010/0247761 A1 | 9/2010 | Hashimoto | |
| 2011/0240601 A1* | 10/2011 | Hashizume et al. | 216/83 |
| 2011/0303248 A1 | 12/2011 | Oshima | |

FOREIGN PATENT DOCUMENTS

| | | |
|---|---|---|
| CN | 101901776 | 12/2010 |
| JP | H06-260467 A | 9/1994 |
| JP | H07-014817 A | 1/1995 |
| JP | H7-254583 | 10/1995 |
| JP | 2001-015402 | 1/2001 |
| JP | 2002-170804 | 6/2002 |
| JP | 2003-051476 A | 2/2003 |
| JP | 2004-024950 | 1/2004 |
| JP | 2004-267871 | 9/2004 |
| JP | 2007-149891 | 6/2007 |
| JP | 2007-258462 | 10/2007 |
| JP | 2007-266430 | 10/2007 |
| JP | 2008-091717 | 4/2008 |
| JP | 2008-118027 | 5/2008 |
| JP | 2010-062352 | 3/2010 |
| JP | 2010-192686 | 9/2010 |
| JP | 4582654 | 11/2010 |
| KR | 10-2007-0036865 | 9/2005 |
| KR | 10-2007-0119897 | 12/2007 |
| KR | 10-2009-0046237 | 5/2009 |
| KR | 10-2009-0070664 | 7/2009 |
| KR | 10-2009-0108857 | 10/2009 |
| KR | 10-2010-0052658 | 5/2010 |
| KR | 10-2012-0015662 | 2/2012 |
| TW | 201041080 | 11/2010 |
| WO | WO 2007/132609 A1 | 11/2007 |

OTHER PUBLICATIONS

Office Action issued by Korean Patent Office on Dec. 22, 2013 in connection with corresponding.
Korean Patent Application No. 10-2013-0121390 with Japanese and English Translation thereof.
Korean Patent Application No. 10-2013-0121389 with Japanese and English Translation thereof.
Office Action issued by Korean Patent Office on Sep. 3, 2014 in connection with corresponding.
Office Action issued by Korean Patent Office on Nov. 3, 2014 in connection with corresponding.
Korean Patent Application No. 10-2014-0102068 with Japanese and English Translation thereof.
Office Action dated Dec. 1, 2014 in corresponding Korean Patent Application No. 10-2012-0076044 with Japanese and English translations.
Office Action dated Mar. 10, 2015 in corresponding Korean Patent Application No. 10-2014-0167154 with Japanese and English translations.
Office Action issued by Korean Patent Office on Aug. 16, 2013 in connection with corresponding.
Korean Patent Application No. 10-2012-0076044swith Japanese and English Translation thereof.
Office Action issued by Korean Patent Office on Feb. 28, 2014 in connection with corresponding.
Korean Patent Application No. 10-2012-0076044 with Japanese and English Translation thereof.
Office Action issued by Korean Patent Office on Aug. 20, 2014 in connection with corresponding.
Office Action dated Feb. 26, 2015 in corresponding Korean Patent Application No. 10-2012-0076044 with Japanese and English translations.
Office Action issued by Chinese Patent Office on Aug. 4, 2014 in connection with corresponding.
Chinese Patent Application No. 201210253759.1 with Japanese and English Translation thereof.
Office Action issued by Taiwanese Patent Office on Sep. 23, 2014 in connection with corresponding.
Taiwanese Patent Application No. 10321323090 with Japanese and English Translation thereof.
Office Action issued by Korean Patent Office on Jun. 27, 2014 in connection with corresponding.
Office Action dated Jun. 2, 2015 in corresponding Japanese Patent Application No. 2011-158896 and English translations.
Office Action dated May 19, 2015 in corresponding Japanese Patent Application No. 2011-158894 (Dispatch No. 223822) with English translation. Portions relevant to prior-art based rejections are translated in English (6 pages).
Office Action dated May 19, 2015 in corresponding Japanese Patent Application No. 2011-158697 (Dispatch No. 223823) with English translation. Portions relevant to prior-art based rejections are translated in English (6 pages).
Office Action dated Jun. 26, 2015 in corresponding Korean Patent Application No. 10-2014-0102068 (Dispatch No. 9-5-2015-042973827). Also attached are the Japanese translation of the Korean Office Action and the English language translation of the Korean Office Action based on the Japanese translation. Portions relevant to prior-art based rejections are translated in English (6 pages).
Office Action dated Nov. 10, 2015 in corresponding Japanese Patent Application No. 2011-158896 and English translations thereof.
Office Action dated Oct. 29, 2015 in corresponding Korean Patent Application No. 10-2014-0167154 and Japanese and English translations thereof.
Office Action dated Oct. 29, 2015 in corresponding Korean Patent Application No. 10-2014-0167312 and Japanese and English translations thereof.
Japanese Office Action dated Feb. 23, 2016 with English translation of portions relevant to prior-art based rejections.
Korean Office Action dated Mar. 9, 2016 with Japanese to English translation of portions relevant to prior-art rejections.

* cited by examiner

F I G . 5
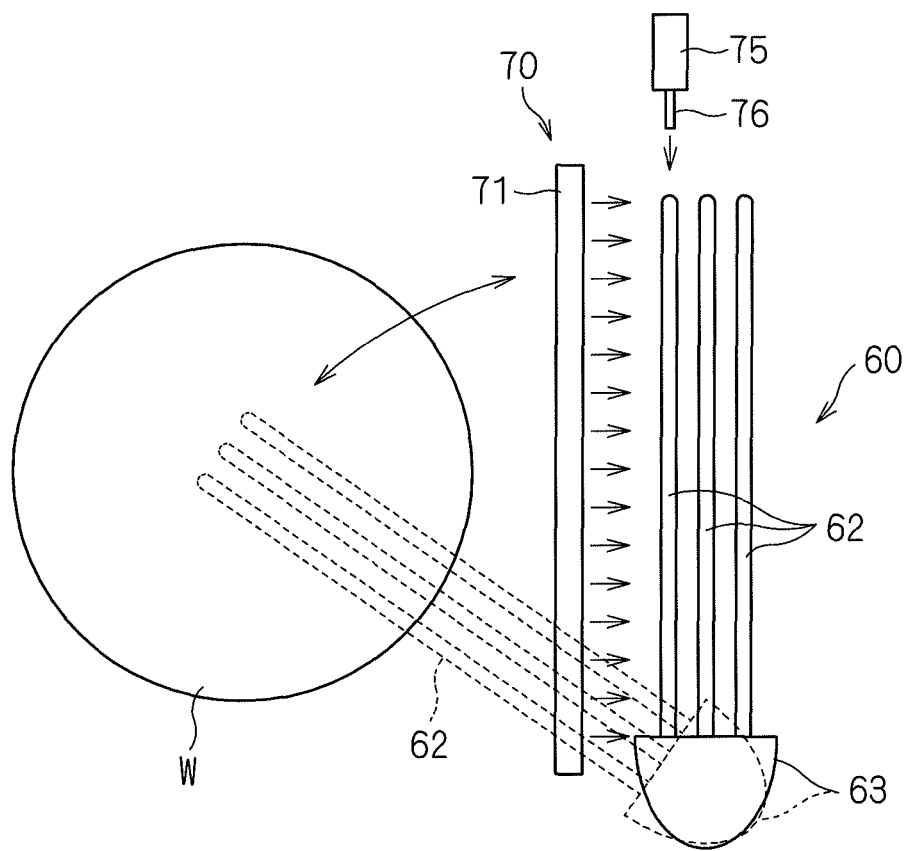

F I G . 8
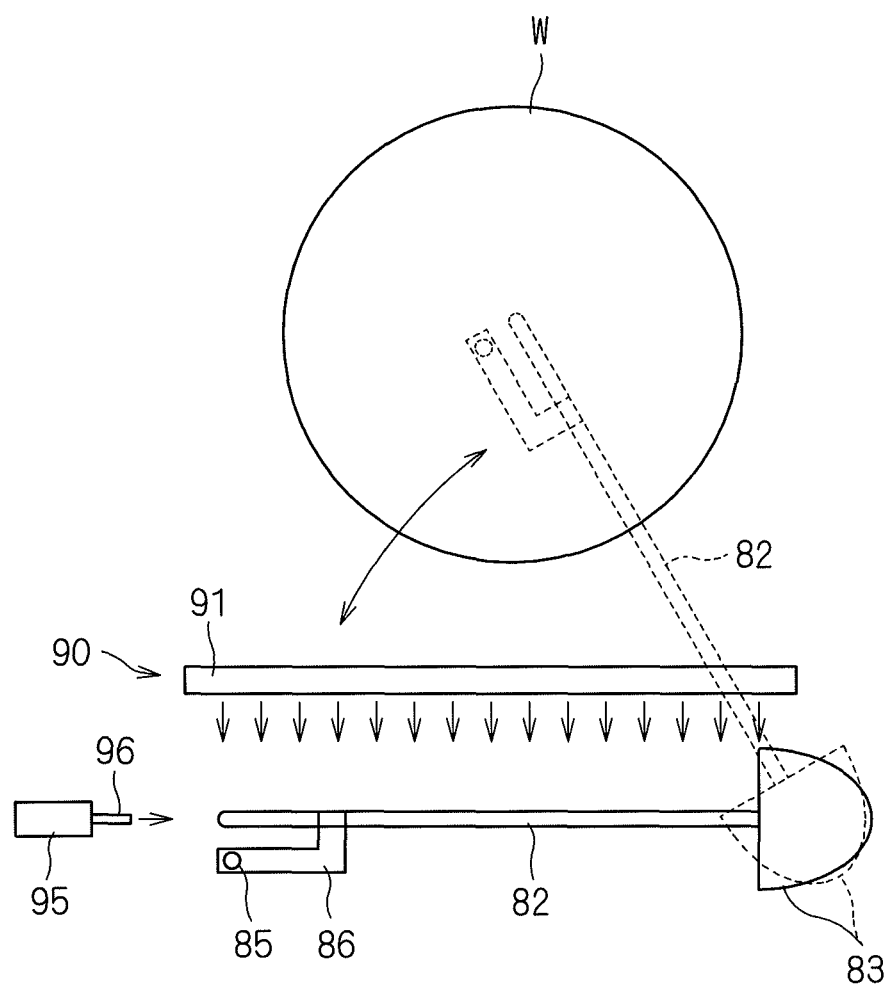

F I G. 9
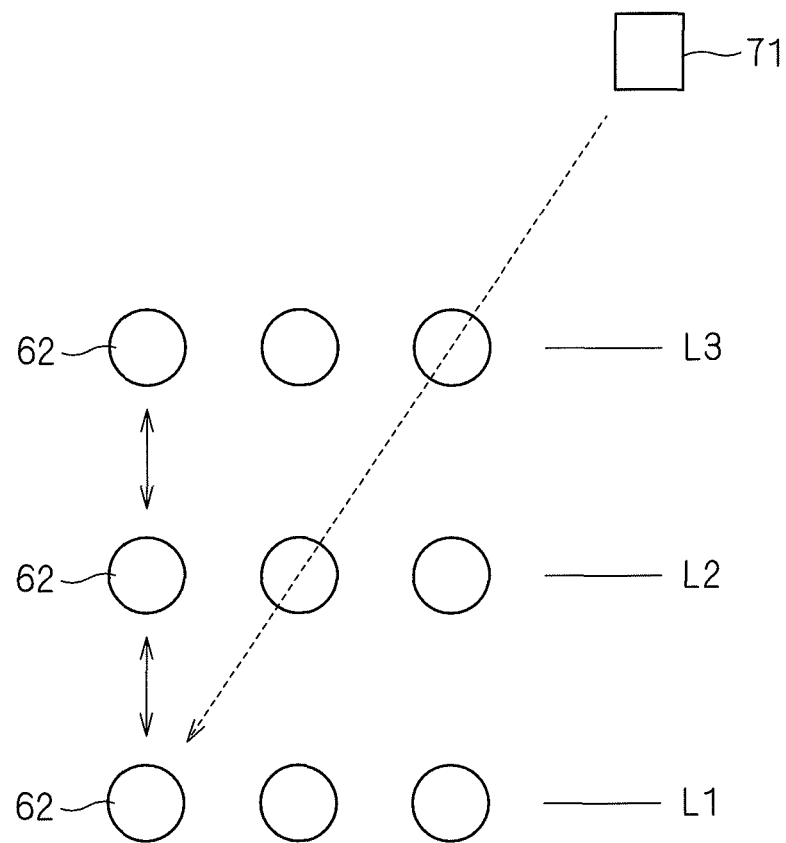

FIG. 10
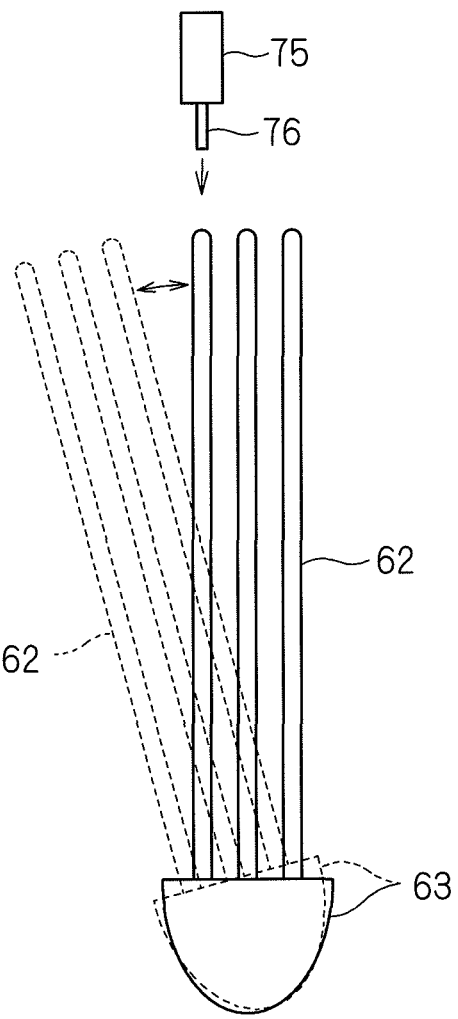
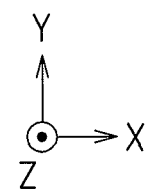

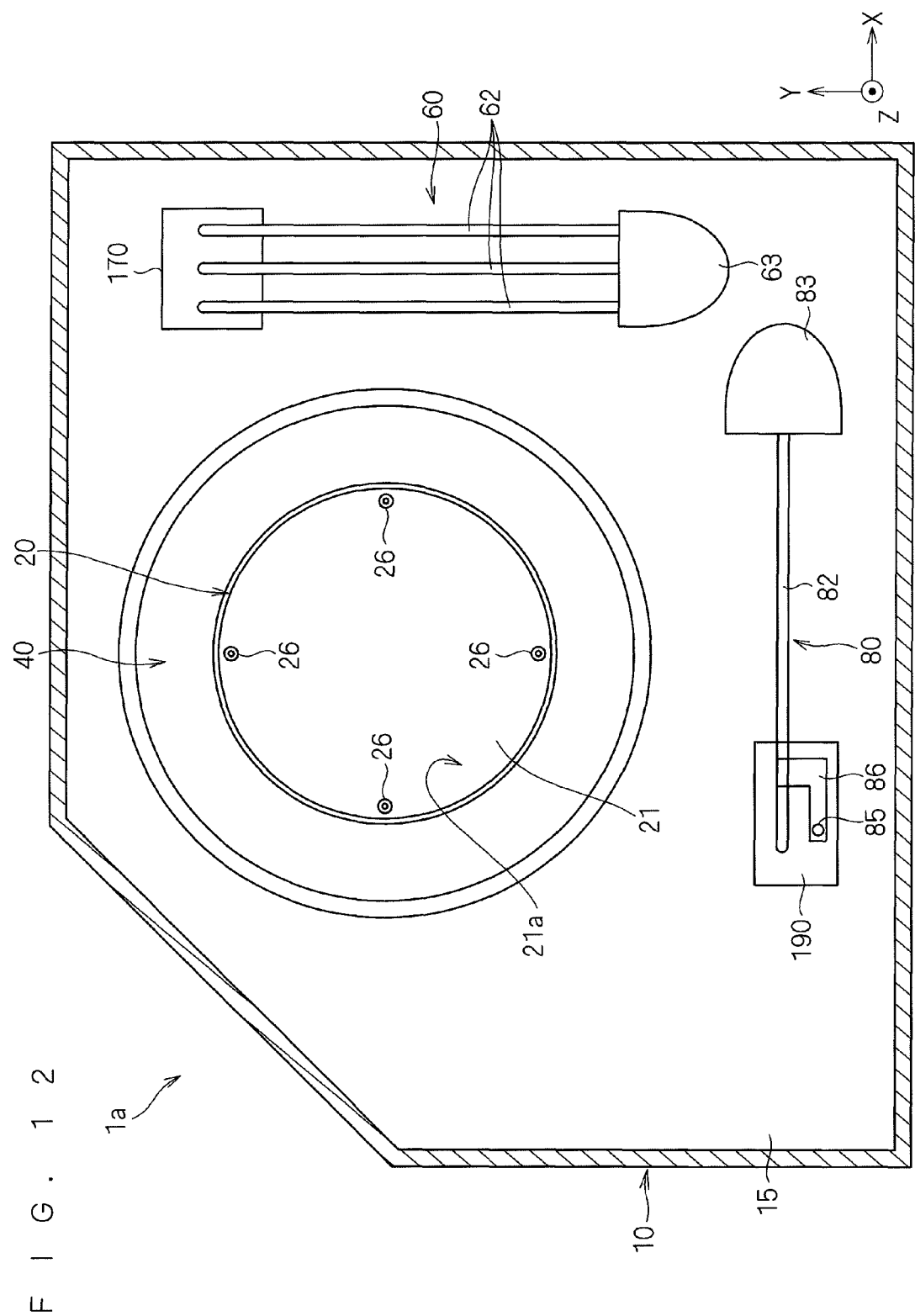

F I G. 1 3
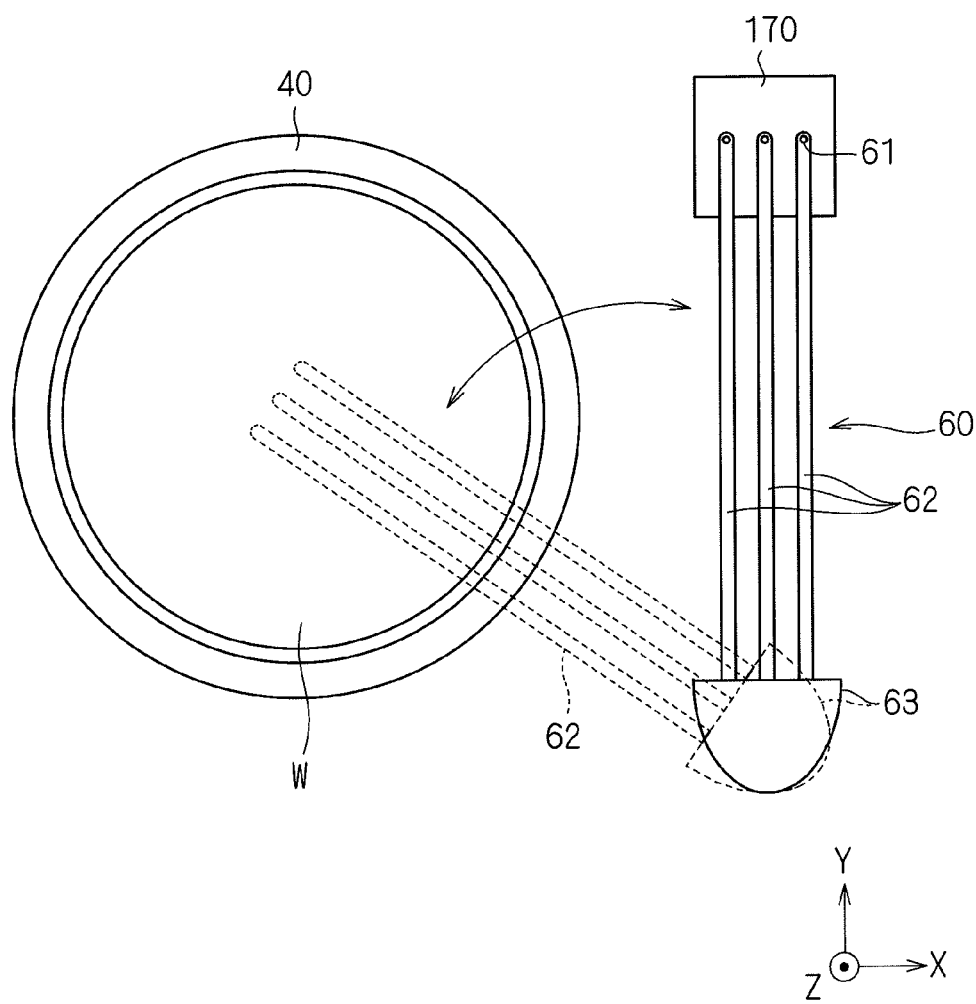

F I G . 1 7
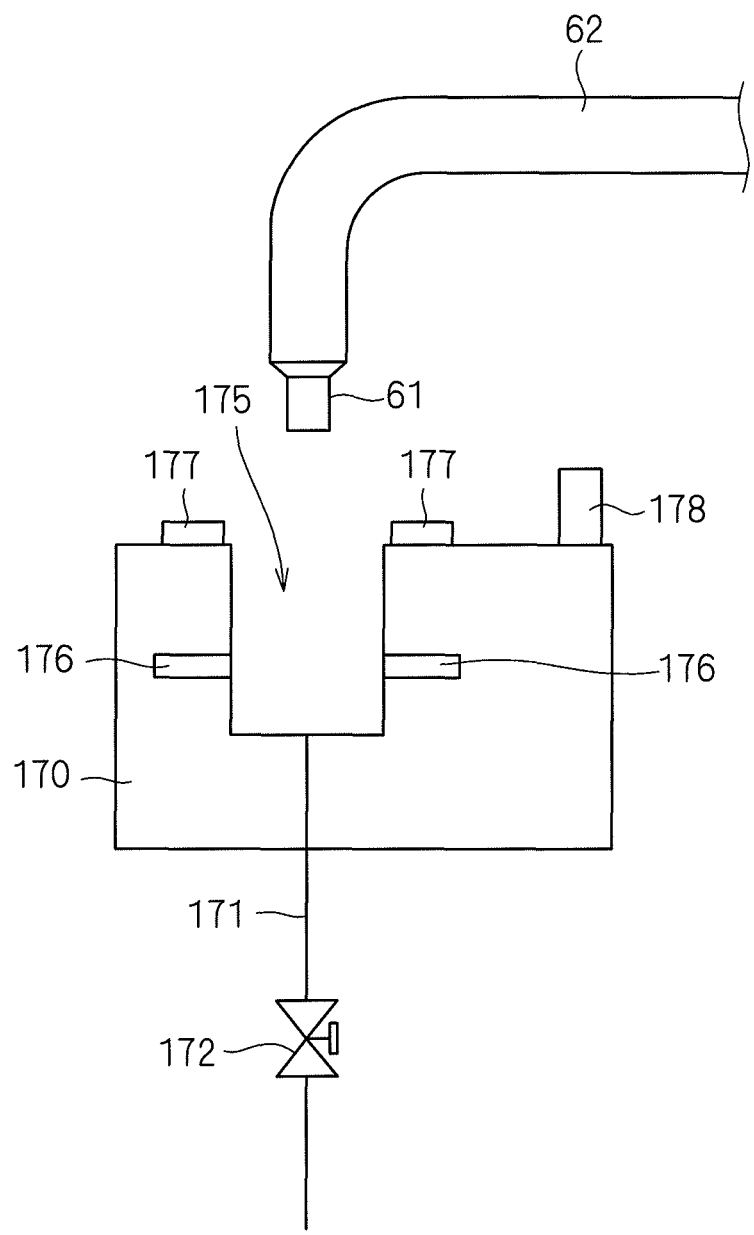

F I G . 1 8
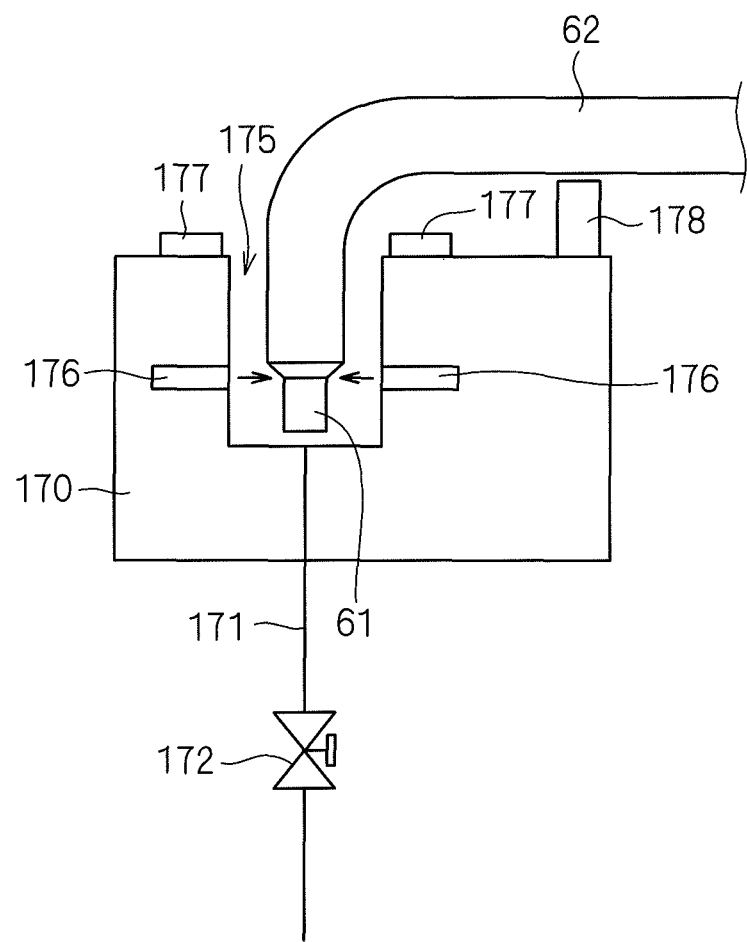

SUBSTRATE PROCESSING APPARATUS AND SUBSTRATE PROCESSING METHOD USING PROCESSING SOLUTION

BACKGROUND OF THE INVENTION

1. Field of the Invention

The present invention relates to a substrate processing apparatus and a substrate processing method that keep the cleanliness of a discharge head for supplying a processing solution to a precision electronic substrate in the form of a thin plate (hereinafter simply called a "substrate") such as a semiconductor wafer or a glass substrate for a liquid crystal display, and a nozzle arm for holding the discharge head.

2. Description of the Background Art

A substrate processing apparatus conventionally employed in a process of manufacturing substrates performs surface process of substrates including process with a chemical solution and rising process with de-ionized water, and subsequent drying process. Such a substrate processing apparatus includes an apparatus employing a single-wafer system of processing substrates one by one, and an apparatus employing a batch system of processing a plurality of substrates at the same time. Generally, the substrate processing apparatus of the single-wafer system performs process with a chemical solution by supplying the chemical solution to a surface of a rotating substrate, rinsing process with de-ionized water by supplying de-ionized water to the substrate, and subsequent spin-drying process by causing the substrate to rotate at high speed. Such a substrate processing apparatus of the single-wafer system is disclosed for example in US 2008/0078428 and in Japanese Patent Application Laid-Open No. 2010-192686, for example.

The substrate processing apparatus disclosed in US 2008/0078428 or Japanese Patent Application Laid-Open No. 2010-192686 includes a spin chuck for causing a substrate to rotate held in a substantially horizontal position thereon, a nozzle (discharge head) for supplying a processing solution to the upper surface of the substrate held on the spin chuck, and a cup surrounding the spin chuck and provided to receive the processing solution scattered from the substrate. The apparatus disclosed in Japanese Patent Application Laid-Open No. 2010-192686 additionally includes a processing chamber housing these components, and a partition plate around the cup provided to divide the processing chamber into parts, one above the other.

In the substrate processing apparatus disclosed in US 2008/0078428 or Japanese Patent Application Laid-Open No. 2010-192686, a processing solution scattered from a rotating substrate and the spin chuck may be attached to the discharge head during process. If the processing solution attached to the discharge head remains unremoved, it may drop onto a substrate to become a source of pollution, or it may generate particles after being dried. Japanese Patent Application Laid-Open No. 2004-267871 discloses a technique of cleaning a processing solution attached to a tip end portion of a discharge head by providing a large-diameter nozzle holder for discharging a cleaning solution around a discharge head for discharging a processing solution. Additionally, Japanese Patent Application Laid-Open No. 2007-149891 discloses a technique of cleaning a discharge head by spraying a cleaning solution on the discharge head in a standby pot placed outside a spin chuck.

However, a processing solution scattered from a rotating substrate and a spin chuck may be attached not only to a discharge head by also to a nozzle arm for holding the discharge head and causing the discharge head to swing. If the processing solution attached to the nozzle arm remains unremoved, it may also drop onto a substrate while the nozzle arm swings to become a source of pollution, or it may generate particles after being dried. Applying the technique of Japanese Patent Application Laid-Open No. 2004-267871 to the substrate processing apparatus of US 2008/0078428 or Japanese Patent Application Laid-Open No. 2010-192686 allows cleaning of a tip end portion of a discharge head, but does not allow cleaning of a nozzle arm for holding the discharge head. Thus, a problem relating to the nozzle arm with the attached processing solution that may become a source of pollution remains unsolved.

Also, cleaning a discharge head by using the technique of Japanese Patent Application Laid-Open No. 2007-149891 makes a cleaning solution used for the cleaning attached to the discharge head. This leads to a new problem in that the cleaning solution attached to the discharge head drops onto a different substrate to be processed after cleaning of the discharge head.

SUMMARY OF THE INVENTION

The present invention is directed to a substrate processing apparatus that supplies a processing solution to a substrate.

According to one aspect of the present invention, the substrate processing apparatus includes: a substrate holding element for holding a substrate in a substantially horizontal position thereon while causing the substrate to rotate; a cup surrounding the substrate holding element; a nozzle arm with a discharge head provided at its tip end, the discharge head discharging a processing solution to a substrate held on the substrate holding element; a pivotal driving part for causing the nozzle arm to pivot such that the discharge head moves between a processing position above a substrate held on the substrate holding element and a standby position outside the cup; and an arm cleaning element for cleaning at least part of the nozzle arm that is to face a substrate held on the substrate holding element when the discharge head has moved to the processing position.

At least part of the nozzle arm that is to face a substrate is cleaned, thereby preventing pollution to be caused by the nozzle arm.

Preferably, the substrate processing apparatus includes an up-and-down driving part for causing the nozzle arm to move up and down. The shower nozzle is fixedly arranged outside the cup, and ejects a cleaning solution obliquely downward. Further, the up-and-down driving part causes the nozzle arm to move up and down such that the nozzle arm cuts across a jet of a cleaning solution discharged from the shower nozzle.

The nozzle arm can be cleaned entirely irrespective of the width of the nozzle arm provided.

Preferably, the shower nozzle ejects a cleaning solution in a direction away from the substrate holding element.

This prevents pollution to be caused by attachment of a cleaning solution to the substrate holding element during cleaning of the nozzle arm.

According to a different aspect of the present invention, the substrate processing apparatus includes: a substrate holding element for holding a substrate in a substantially horizontal position thereon while causing the substrate to rotate; a cup surrounding the substrate holding element; a nozzle arm with a discharge head provided at its tip end, the discharge head discharging a processing solution onto a substrate held on the substrate holding element; a pivotal driving part for causing the nozzle arm to pivot such that the discharge head moves between a processing position above a substrate held on the substrate holding element and a standby position outside the cup; and a gas ejecting part. The gas ejecting part ejects a drying gas to be sprayed on at least part of the nozzle arm to dry this part of the nozzle arm when the discharge head has moved back from the processing position to the standby position, the part of the nozzle arm being to face a substrate held on the substrate holding element when the discharge head has moved to the processing position.

At least part of the nozzle arm to face a substrate is dried to remove a processing solution attached to this part, thereby preventing pollution to be caused by the nozzle arm having received the processing solution during process.

Preferably, the gas ejecting part is configured to eject a drying gas to be sprayed on the nozzle arm each time the discharge head has moved back from the processing position to the standby position after process of discharging a processing solution onto one substrate is finished.

Thus, the nozzle arm having received a processing solution during process of one substrate will not pollute a substrate to be processed next.

According to still another aspect of the present invention, the substrate processing apparatus includes: a substrate holding element for holding a substrate in a substantially horizontal position thereon while causing the substrate to rotate; a cup surrounding the substrate holding element; a nozzle arm with a discharge head provided at its tip end, the discharge head discharging a processing solution to a substrate held on the substrate holding element; a pivotal driving part for causing the nozzle arm to pivot such that the discharge head moves between a processing position above a substrate held on the substrate holding element and a standby position outside the cup; a standby pot arranged at the standby position, the standby pot housing the discharge head; a cleaning element provided to the standby pot, the cleaning element cleaning the discharge head housed in the standby pot by supplying a cleaning solution to the discharge head; and a drying element provided to the standby pot, the drying element drying the discharge head after being cleaned by the cleaning element by ejecting a drying gas to be sprayed on the discharge head.

When the cleaned discharge head has moved to the processing position, a cleaning solution will not drop onto a substrate from the discharge head.

The present invention is also directed to a substrate processing method that supplies a processing solution to a substrate.

According to one aspect of the present invention, the substrate processing method includes the steps of (a) causing a nozzle arm to pivot such that a discharge head arranged at the tip end thereof moves between a processing position and a standby position, the discharge head discharging a processing solution to a substrate held on a substrate holding element in a substantially horizontal position while being caused to rotate by the substrate holding element, the processing position being above a substrate held on the substrate holding element, the standby position being outside a cup surrounding the substrate holding element, and (b) cleaning at least part of the nozzle arm that is to face a substrate held on the substrate holding element when the discharge head has moved to the processing position.

At least part of the nozzle arm that is to face a substrate is cleaned, thereby preventing pollution to be caused by the nozzle arm.

According to another aspect of the present invention, the substrate processing method includes the steps of: (a) causing a nozzle arm with a discharge head provided at its tip end to pivot to move the discharge head to a processing position above a substrate held on a substrate holding element in a substantially horizontal position while being caused to rotate by the substrate holding element, and discharging a processing solution from the discharge head to the substrate; (b) causing the nozzle arm to pivot to move the discharge head from the processing position back to a standby position outside a cup surrounding the substrate holding element; and (c) ejecting a drying gas from a gas ejecting part to be sprayed on at least part of the nozzle arm to dry this part of the nozzle arm when the discharge head has moved back from the processing position to the standby position. The part of the nozzle arm is to face a substrate held on the substrate holding element when the discharge head has moved to the processing position.

At least part of the nozzle arm to face a substrate is dried to remove a processing solution attached to this part, thereby preventing pollution to be caused by the nozzle arm having received the processing solution during process.

According to still another aspect of the present invention, the substrate processing method includes the steps of: (a) causing a nozzle arm with a discharge head provided at its tip end to pivot to move the discharge head to a processing position above a substrate held on a substrate holding element while being caused to rotate by the substrate holding element, and discharging a processing solution from the discharge head to the substrate; (b) causing the nozzle arm to pivot to move the discharge head from the processing position back to a standby position outside a cup surrounding the substrate holding element, and housing the discharge head in a standby pot arranged at the standby position, (c) cleaning the discharge head housed in the standby pot by supplying a cleaning solution to the discharge head from a cleaning element provided to the standby pot; and (d) drying the discharge head after being cleaned in the step (c) by spraying a drying gas on the discharge head ejected from a drying element provided to the standby pot.

When the cleaned discharge head has moved to the processing position, a cleaning solution will not drop onto a substrate from the discharge head.

Thus, it is an object of the present invention to prevent pollution to be caused by the discharge head and the nozzle arm for holding the discharge head.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 shows how the upper processing solution nozzle pivots;

FIG. 8 shows how the two-fluid nozzle pivots;

FIG. 9 schematically shows how three nozzle arms are cleaned while being caused to move up and down;

FIG. 10 schematically shows how the three nozzle arms are dried while being caused to swing;

FIG. 12 is a plan view of a substrate processing apparatus of a third preferred embodiment;

FIG. 13 is a plan view schematically showing the operation of an upper processing solution nozzle;

FIGS. 17 to 20 show procedure of cleaning process of a discharge head 61 of the upper processing solution nozzle.

DESCRIPTION OF THE PREFERRED EMBODIMENTS

Figure 1:
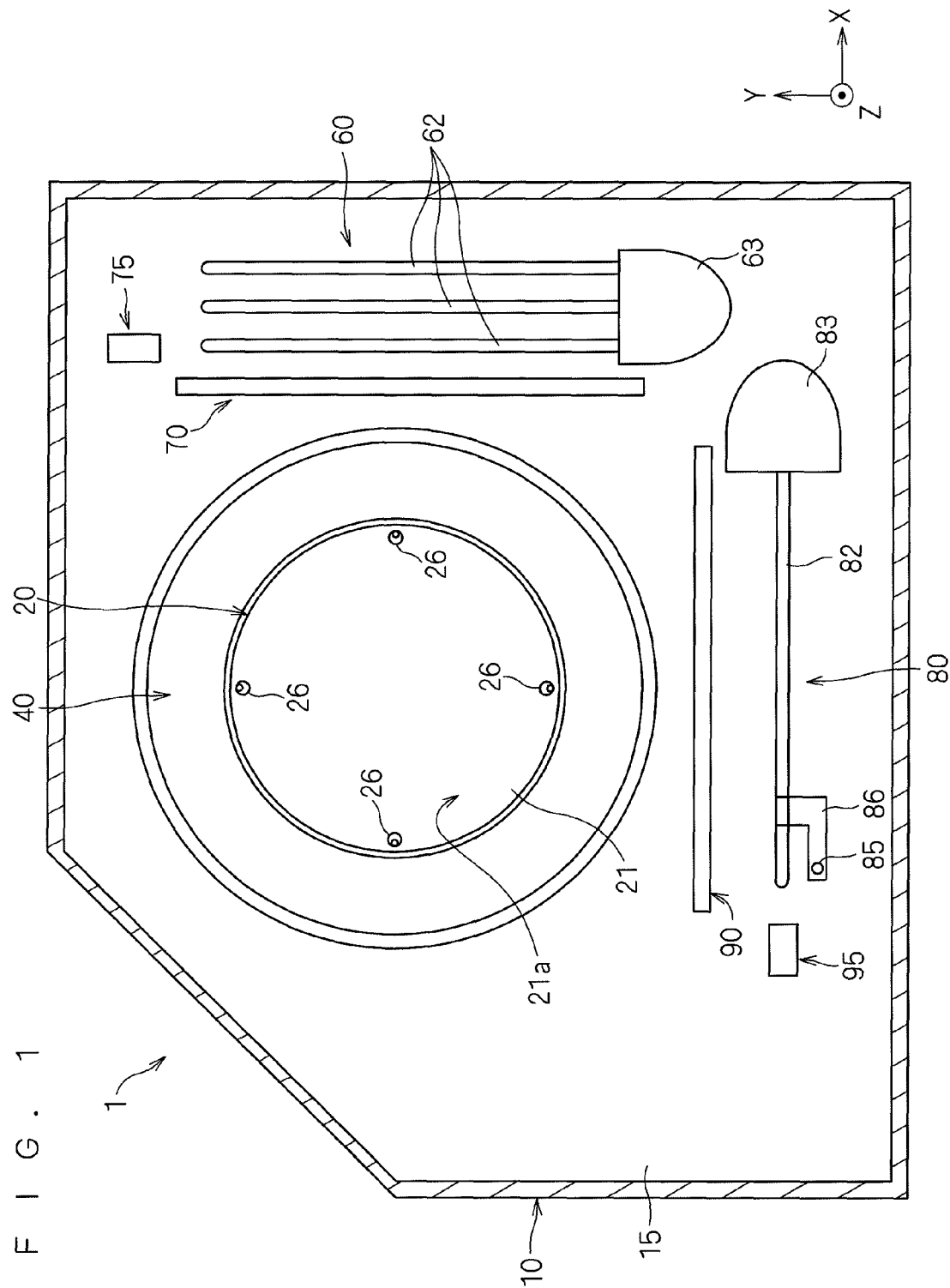
FIG. 1 is a plan view of a substrate processing apparatus of the present invention.

Preferred embodiments of the present invention are described in detail below by referring to the drawings.

First Preferred Embodiment

Figure 2:
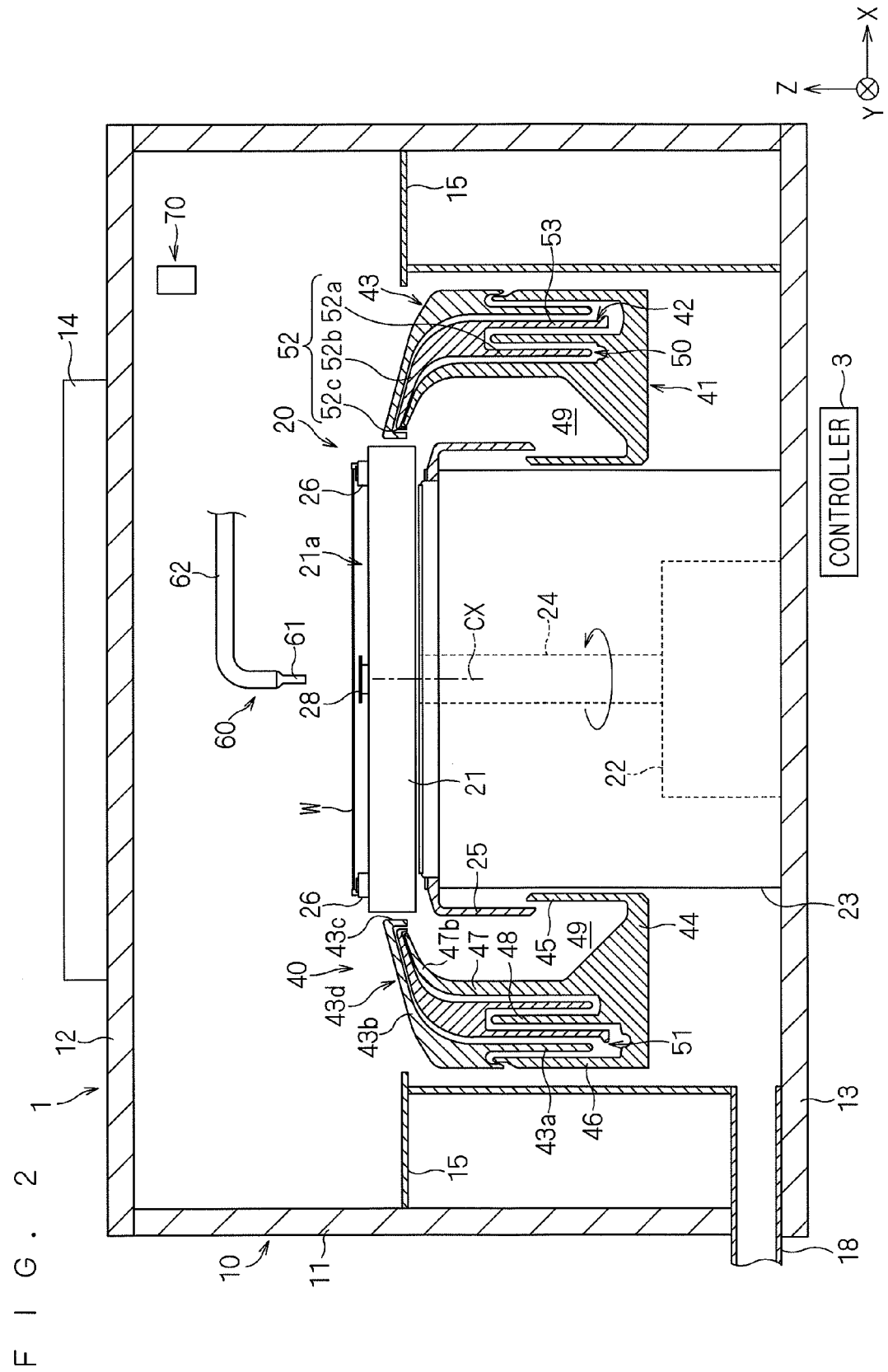
FIG. 2 is a vertical sectional view of the substrate processing apparatus of FIG. 1.

FIG. 1 is a plan view of a substrate processing apparatus 1 of the present invention. FIG. 2 is a vertical sectional view of the substrate processing apparatus 1. In order to show relationships of directions among FIG. 1 and its subsequent figures, an XYZ rectangular coordinate system defining a Z-axis direction as the vertical direction and defining an XY plane as the horizontal plane is given to FIG. 1 and its subsequent figures as the need arises. In order to facilitate understanding, the dimensions of components and the numbers of the components are exaggerated or simplified where appropriate.

The substrate processing apparatus 1 is a substrate processing apparatus employing a single-wafer system of processing semiconductor substrates W one by one. The substrate processing apparatus 1 performs process with a chemical solution and rinsing process with de-ionized water on a circular silicon substrate W, and then performs drying process on the substrate W. FIG. 1 shows a condition where a substrate W is not held on a spin chuck 20. FIG. 2 shows a condition where a substrate W is held on the spin chuck 20.

Main components of the substrate processing apparatus 1 housed in a chamber 10 include the spin chuck 20 on which a substrate W is held in a horizontal position (position that makes the normal of the substrate W extend in the vertical direction), an upper processing solution nozzle 60 for supplying a processing solution onto the upper surface of a substrate W held on the spin chuck 20, a two-fluid nozzle 80 for spraying a mixed fluid of droplets of a processing solution and gas onto a substrate W, and a processing cup 40 surrounding the spin chuck 20. A partition plate 15 is provided around the processing cup 40 in the chamber 10. The partition plate 15 divides the space inside the chamber 10 into parts, one above the other. In the present specification, a processing solution is a generic term for a chemical solution and de-ionized water.

The chamber 10 has a side wall 11 extending in the vertical direction, a ceiling wall 12 enclosing space from above surrounded by the side wall 11, and a floor wall 13 enclosing the space from below. The space surrounded by the side wall 11, the ceiling wall 12, and the floor wall 13 functions as processing space for a substrate W. Further, part of the side wall 11 of the chamber 10 is given a port through which a substrate W is transferred into the chamber 10 and out of the chamber 10, and a shutter to open and close the port (both the port and the shutter are not shown in the drawings).

The ceiling wall 12 of the chamber 10 is provided with a fan filter unit (FFU) 14 that improves the cleanness of air in a clean room in which the substrate processing apparatus 1 is placed, and supplies the cleaned air into the processing space in the chamber 10. The fan filter unit 14 includes a fan for taking the air inside the clean room and feeding the air into the chamber 10 and a filter (such as a HEPA filter), and forms a downflow of the cleaned air in the processing space in the chamber 10. A punching plate with many blowholes may be provided directly below the ceiling wall 12 in order to realize uniform distribution of the cleaned air supplied from the fan filter unit 14.

The spin chuck 20 includes a spin base 21 in the form of a circular disk fixed in a horizontal position to the upper end of a rotary shaft 24 extending in the vertical direction, a spin motor 22 provided below the spin base 21 and which causes the rotary shaft 24 to rotate, and a cylindrical cover member 23 surrounding the spin motor 22. The outer diameter of the spin base 21 in the form of a circular disk is slightly larger than the diameter of a circular substrate W held on the spin chuck 20. So, a holding surface 21a of the spin base 21 faces the entire lower surface of a substrate W to be held on the spin base 21.

A plurality of (in the first preferred embodiment, four) chuck members 26 is provided in upright positions at peripheral edges of the holding surface 21a of the spin base 21. The chuck members 26 are uniformly spaced (if four chuck members 26 are provided as in the first preferred embodiment, they are spaced at intervals of 90 degrees) along a circumference corresponding to the outer circumference of a circular substrate W. The chuck members 26 are driven in synchronization with each other by a link mechanism not shown in the drawings housed in the spin base 21. The spin chuck 20 makes abutting contact of each of the chuck members 26 with a corresponding peripheral edge of a substrate W to grasp the substrate W, thereby holding the substrate W in a horizontal position above the spin base 21 and near the holding surface 21a (see FIG. 2). The spin chuck 20 also separates each of the chuck members 26 from a corresponding peripheral edge of a substrate W, thereby releasing the substrate W from the grasp.

The cover member 23 covering the spin motor 22 has a lower end fixed to the floor wall 13 of the chamber 10, and an upper end reaching as far as to a position directly below the spin base 21. An upper end portion of the cover member 23 is provided with a flange member 25 projecting in a substantially horizontal position outward of the cover member 23, and further bending downward. While the spin chuck 20 holds a substrate W by causing the chuck members 26 to grasp the substrate W, the spin motor 22 causes the rotary shaft 24 to rotate, thereby allowing the substrate W to rotate about an axis of rotation CX extending in the vertical direction and passing through the center of the substrate W. A controller 3 controls drive of the spin motor 22.

The processing cup 40 surrounding the spin chuck 20 includes an inner cup 41, a middle cup 42, and an outer cup 43 that are capable of moving up and down independently of each other. The inner cup 41 has a shape surrounding the spin chuck 20, and exhibiting substantially rotational symmetry about the axis of rotation CX passing through the center of a substrate W held on the spin chuck 20. The inner cup 41 has a bottom section 44 having a toroidal shape in plan view, a cylindrical inner wall section 45 extending upward from an inner periphery of the bottom section 44, a cylindrical outer wall section 46 extending upward from an outer periphery of the bottom section 44, a first guide section 47 extending upward from a position between the inner and outer wall sections 45 and 46 and having an upper end portion that extends obliquely upward in the pattern of a smooth circular arc toward the center (in a direction to get closer to the axis of rotation CX of a substrate W held on the spin chuck 20), and a cylindrical middle wall section 48 extending upward from a position between the first guide section 47 and the outer wall section 46.

The inner wall section 45 has a length that places the inner wall section 45 between the cover member 23 and the flange member 25 with appropriate clearance left therebetween when the inner cup 41 is at its highest position. The middle wall section 48 has a length that places the middle wall section 48 between a second guide section 52 and a processing solution dividing wall 53 of the middle cup 42 described later with appropriate clearance left therebetween when the inner and middle cups 41 and 42 are at their closest positions.

The first guide section 47 has an upper end portion 47b that extends obliquely upward in the pattern of a smooth circular arc toward the center (in a direction to get closer to the axis of rotation CX of a substrate W). A disposal slot 49 is formed between the inner wall section 45 and the first guide section 47 in which a used processing solution is collected and disposed of. A toroidal inner recovery slot 50 is formed between the first guide section 47 and the middle wall section 48 in which a used processing solution is collected and recovered. Also, a toroidal outer recovery slot 51 is formed between the middle and outer wall sections 48 and 46 in which a processing solution of a type different from that collected in the inner recovery slot 50 is collected and recovered.

The disposal slot 49 is connected to a discharge mechanism not shown in the drawings that discharges a processing solution collected in the disposal slot 49, and forcibly extracts air from the disposal slot 49. As an example, four discharge mechanisms are provided that are uniformly spaced in the circumferential direction of the disposal slot 49. Further, recovery mechanisms (both of which are not shown in the drawings) are connected to the inner and outer recovery slots 50 and 51 by which processing solutions collected in the inner and outer recovery slots 50 and 51 respectively are recovered in a recovery tank provided outside the substrate processing apparatus 1. Respective bottom portions of the inner and outer recovery slots 50 and 51 are tilted at slight angles with respect to the horizontal direction, and the respective recovery mechanisms are connected to the lowest positions of the bottom portions. This allows smooth recovery of processing solutions flowing into the inner and outer recovery slots 50 and 51.

The middle cup 42 has a shape surrounding the spin chuck 20, and exhibiting substantially rotational symmetry about the axis of rotation CX passing through the center of a substrate W held on the spin chuck 20. The middle cup 42 has the integrally formed second guide section 52, and the cylindrical processing solution dividing wall 53 coupled to the second guide section 52.

The second guide section 52 is placed outside the first guide section 47 of the inner cup 41. The second guide section 52 has a cylindrical lower end portion 52a coaxial with a lower end portion of the first guide section 47, an upper end portion 52b extending obliquely upward from the upper end of the lower end portion 52a in the pattern of a smooth circular arc toward the center (in a direction to get closer to the axis of rotation CX of a substrate W), and a bent portion 52c formed by bending the tip end of the upper end portion 52b downward. The lower end portion 52a is placed in the inner recovery slot 50 with appropriate clearance left between the first guide section 47 and the middle wall section 48 when the inner and middle cups 41 and 42 are at their closest positions. The upper end portion 52b is arranged to cover the upper end portion 47b of the first guide section 47 of the inner cup 41 from above. The upper end portion 52b is close to the upper end portion 47b of the first guide section 47 with slight clearance left therebetween when the inner and middle cups 41 and 42 are at their closest positions. The bent portion 52c formed by bending the tip end of the upper end portion 52b downward has a length that makes the bent portion 52c cover the tip end of the upper end portion 47b of the first guide section 47 from the side when the inner and middle cups 41 and 42 are at their closest positions.

The upper end portion 52b of the second guide section 52 becomes thicker with approach toward its bottom. The processing solution dividing wall 53 has a cylindrical shape extending downward from a peripheral portion at the lower end of the upper end portion 52b. The processing solution dividing wall 53 is placed in the outer recovery slot 51 with appropriate clearance left between the middle wall section 48 and the outer cup 43 when the inner and middle cups 41 and 42 are at their closest positions.

The outer cup 43 is provided outside the second guide section 52 of the middle cup 42. The outer cup 43 has a shape surrounding the spin chuck 20, and exhibiting substantially rotational symmetry about the axis of rotation CX passing through the center of a substrate W held on the spin chuck 20. The outer cup 43 functions as a third guide section. The outer cup 43 has a cylindrical lower end portion 43a coaxial with the lower end portion 52a of the second guide section 52, an upper end portion 43b extending obliquely upward from the upper end of the lower end portion 43a in the pattern of a smooth circular arc toward the center (in a direction to get closer to the axis of rotation CX of a substrate W), and a bent portion 43c formed by bending the tip end of the upper end portion 43b downward.

The lower end portion 43a is placed in the outer recovery slot 51 with appropriate clearance left between the processing solution dividing wall 53 of the middle cup 42 and the outer wall section 46 of the inner cup 41 when the inner and outer cups 41 and 43 are at their closest positions. The upper end portion 43b is arranged to cover the second guide section 52 of the middle cup 42 from above. The upper end portion 43b is close to the upper end portion 52b of the second guide section 52 with slight clearance left therebetween when the middle and outer cups 42 and 43 are at their closest positions. The bent portion 43c formed by bending the tip end of the upper end portion 43b downward has a length that makes the bent portion 43c cover the bent portion 52c of the second guide section 52 from the side when the middle and outer cups 42 and 43 are at their closest positions.

The inner, middle and outer cups 41, 42 and 43 are capable of moving up and down independently of each other. To be specific, the inner, middle and outer cups 41, 42 and 43 are given their respective lifting mechanisms (not shown in the drawings) that move corresponding ones of the inner, middle and outer cups 41, 42 and 43 up and down separately. Various publicly known mechanisms such as a ball screw mechanism and an air cylinder may be employed as these lifting mechanisms.

Figure 3:
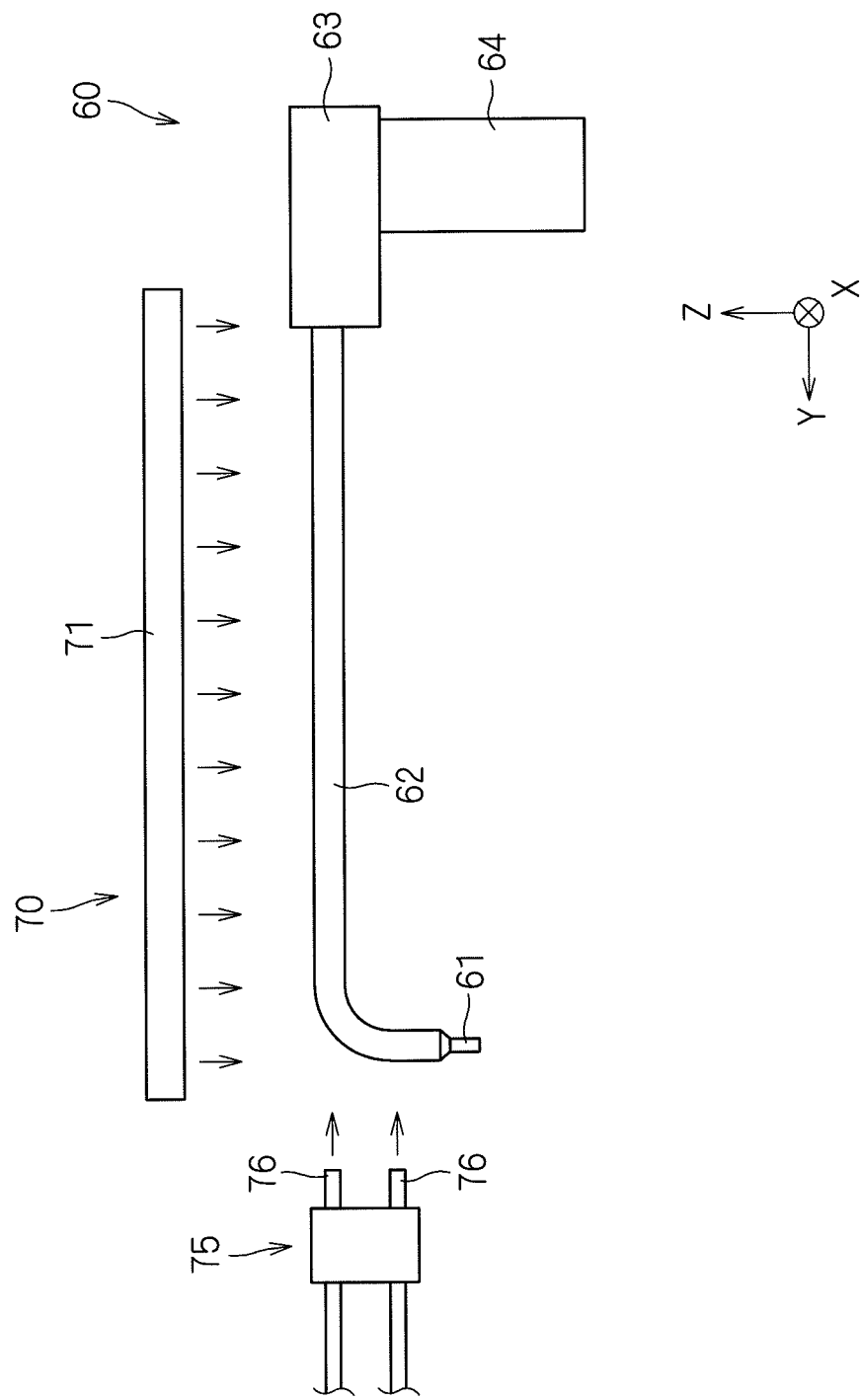
FIG. 3 is a side view of an upper processing solution nozzle.
Figure 4:
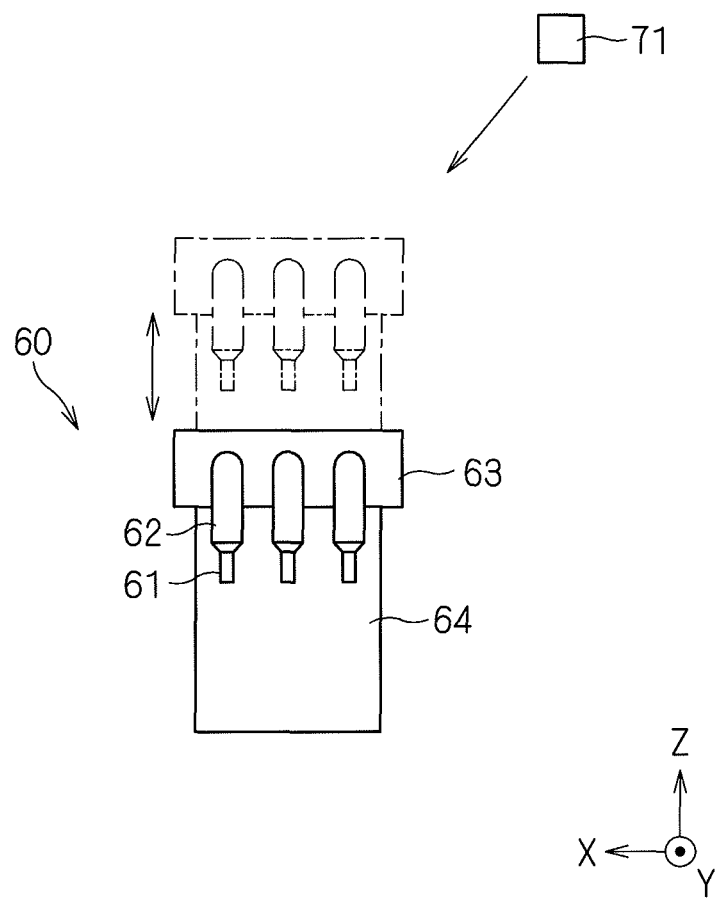
FIG. 4 is a front view of the upper processing solution nozzle as viewed from the tip end thereof.

FIG. 3 is a side view of the upper processing solution nozzle 60. FIG. 4 is a front view of the upper processing solution nozzle 60 as viewed from the tip end thereof. The upper processing solution nozzle 60 is composed of three parallel nozzle arms 62, and discharge heads 61 attached to the tip ends of the corresponding nozzle arms 62. The base ends of the three nozzle arms 62 are coupled to a pivotal driving part 63. The three nozzle arms 62 are coupled to the pivotal driving part 63 such that the nozzle arms 62 are arranged in parallel to each other in the horizontal direction. The pivotal driving part 63 is arranged outside the processing cup 40. The pivotal driving part 63 is capable of making pivotal movement about an axis extending in the vertical direction caused by a pivotal motor (not shown in the drawings) provided therein. The pivotal driving part 63 is capable of causing the three nozzle arms 62 to pivot together in the horizontal plane (XY plane).

FIG. 5 shows how the upper processing solution nozzle 60 pivots. As shown in FIG. 5, the pivotal driving part 63 causes the nozzle arms 62 to pivot in the horizontal plane such that the discharge heads 61 move in an arcuate pattern between a processing position above a substrate W held on the spin chuck 20 and a standby position outside the processing cup 40. The positions of the three nozzle arms 62 indicated by dotted lines of FIG. 5 are determined when the discharge heads 61 are at the processing position. The positions of the three nozzle arms 62 indicated by solid lines of FIG. 5 are determined when the discharge heads 61 are at the standby position. The pivotal movement of the nozzle arms 62 causing the discharge heads 61 to move between the processing position and the standby position is also called the pivotal movement of the nozzle arms 62 between the processing position and the standby position.

As shown in FIG. 3, the base end of each of the three nozzle arms 62 is coupled to the pivotal driving part 63 such that the nozzle arm 62 extends in the horizontal direction from the pivotal driving part 63. The tip end of each of the nozzle arms 62 extends downward in the pattern of a smooth circular arc. The discharge heads 61 through which a processing solution is discharged onto a substrate W held on the spin chuck 20 are attached to the tip ends of the corresponding nozzle arms 62 extending downward in the vertical direction (in the direction toward −Z side). The discharge heads 61 are configured to receive processing solutions of several types (including at least de-ionized water) supplied through the inner sides of the nozzle arms 62 from a processing solution supplying mechanism provided in a place outside the drawings. The processing solutions supplied to the discharge heads 61 are discharged from the discharge heads 61 downward in the vertical direction. The processing solutions discharged from the discharge heads 61 at the processing position above a substrate W held on the spin chuck 20 reach the upper surface of the substrate W. Meanwhile, if the discharge heads 61 are at the standby position outside the processing cup 40, the nozzle arms 62 are also on standby outside the processing cup 40 while extending in the Y direction (see FIGS. 1 and 5).

The pivotal driving part 63 is attached to an up-and-down driving part 64. An up-and-down motor (not shown in the drawings) provided inside the up-and-down driving part 64 drives the up-and-down driving part 64. In response, the up-and-down driving part 64 causes the pivotal driving part 63, the three discharge heads 61, and the three nozzle arms 62 to move up and down together in the vertical direction.

An arm cleaning part 70 and an arm drying part 75 are provided near the standby position of the discharge heads 61 and the nozzle arms 62. The arm cleaning part 70 has a shower nozzle 71. The shower nozzle 71 is fixedly provided at a position obliquely above the nozzle arms 62 at the standby position and closer to the spin chuck 20 (closer to −X side) than the nozzle arms 62 at the standby position. The shower nozzle 71 extends in parallel to the nozzle arms 62 at the standby position, namely, extends in the Y direction. The length of the shower nozzle 71 in the Y direction is longer than the length of the nozzle arms 62 in the Y direction. Further, the shower nozzle 71 is provided with a plurality of ejection holes arranged in the Y direction. A cleaning solution is ejected through the ejection holes obliquely downward toward the upper processing solution nozzle 60.

The shower nozzle 71 is configured to receive a cleaning solution (in the first preferred embodiment, de-ionized water) supplied from a cleaning solution supplying mechanism provided in a place outside the drawings. In response to supply of the cleaning solution to the shower nozzle 71, the cleaning solution is ejected through the ejection holes of the shower nozzle 71 toward the upper processing solution nozzle 60 arranged obliquely downward of the shower nozzle 71 (see FIGS. 3 to 5). As a result, the three nozzle arms 62 of the upper processing solution nozzle 60 are cleaned as is described in more detail later.

The arm drying part 75 has two drying gas nozzles 76. The drying gas nozzles 76 are fixedly provided at a position closer to +Y side than the nozzle arms 62 at the standby position, and at substantially the same height as the nozzle arms 62 at the standby position. In the first preferred embodiment, the two drying gas nozzles 76 are provided at a position facing one of the three nozzle arms 62 at the standby position that is the closest to the spin chuck 20 (closest to −X side). The two drying gas nozzles 76 of the arm drying part 75 are arranged one above the other with a predetermined distance therebetween (see FIG. 3). Each of the drying gas nozzles 76 extends in the horizontal direction.

The two drying gas nozzles 76 are configured to receive a drying gas (in the first preferred embodiment, nitrogen ($N_2$) gas) supplied from a drying gas source provided in a place outside the drawings. In response to supply of the drying gas to the drying gas nozzles 76, the drying gas is ejected from the tip ends of the drying gas nozzle 76 and sprayed toward the upper processing solution nozzle 60 (see FIGS. 3 and 5). The drying gas nozzles 76 are provided forward of the tip ends of the nozzle arms 62 (closer to +Y side than the tip ends of the nozzle arms 62), so the drying gas is first sprayed on the tip ends of the nozzle arms 62.

Figure 6:
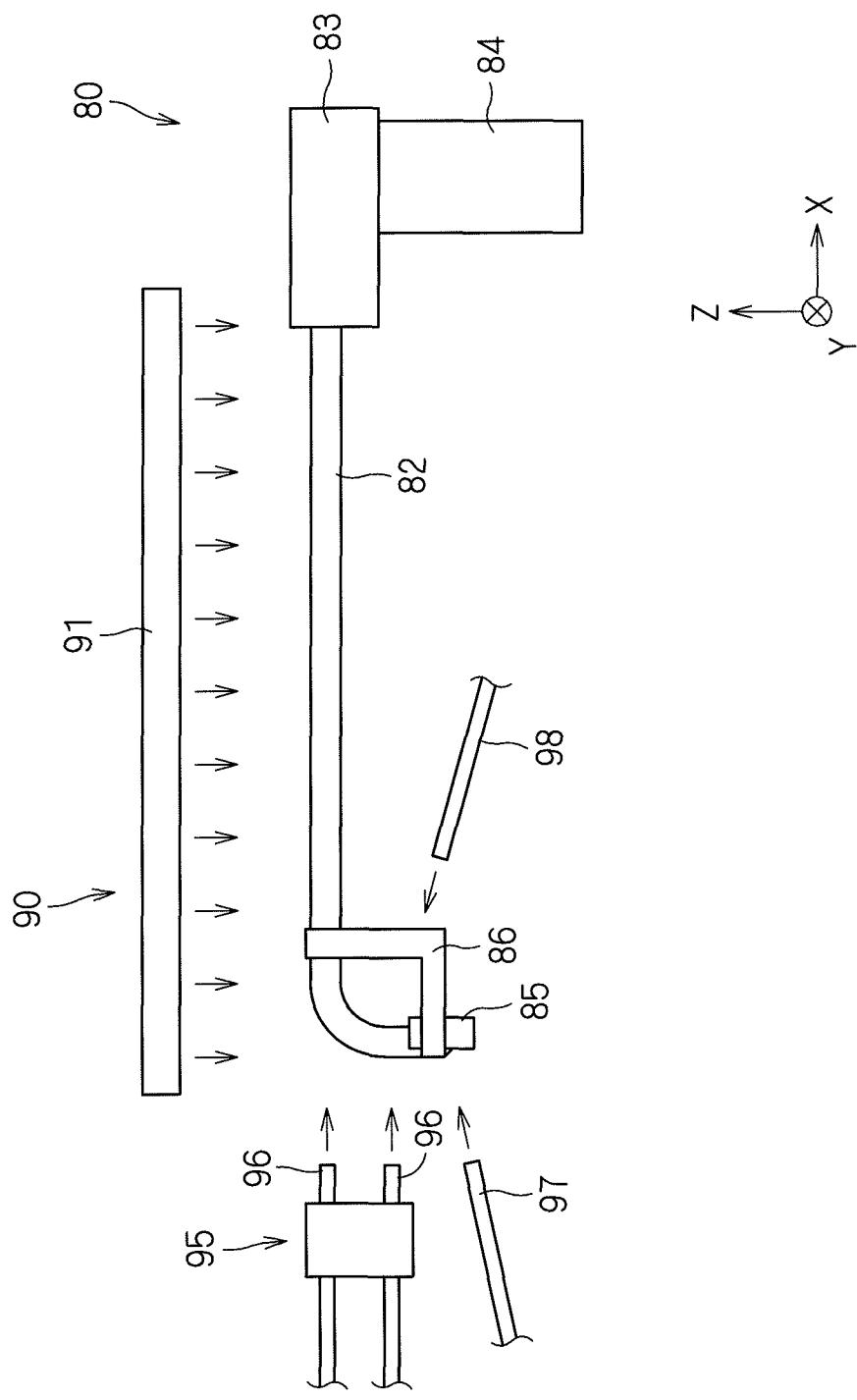
FIG. 6 is a side view of a two-fluid nozzle.
Figure 7:
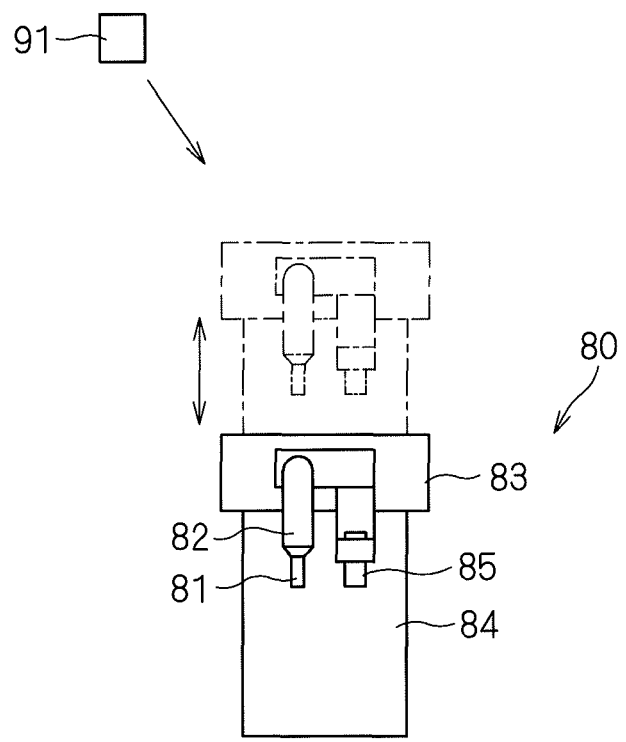
FIG. 7 is a front view of the two-fluid nozzle as viewed from the tip end thereof.

The substrate processing apparatus 1 includes a two-fluid nozzle 80 in addition to the upper processing solution nozzle 60. FIG. 6 is a side view of the two-fluid nozzle 80. FIG. 7 is a front view of the two-fluid nozzle 80 as viewed from the tip end thereof. The two-fluid nozzle 80 is a cleaning nozzle that generates droplets by mixing a processing solution such as de-ionized water and pressurized gas, and ejects a mixed fluid of the droplets and the gas to be sprayed onto a substrate W. The two-fluid nozzle 80 has a discharge head 81 attached to the tip end of a nozzle arm 82, and a gas head 85 attached to a support member 86 branching off the nozzle arm 82. The base end of the nozzle arm 82 is coupled to a pivotal driving part 83. The pivotal driving part 83 is provided outside the processing cup 40. The pivotal driving part 83 is capable of making pivotal movement about an axis extending in the vertical direction caused by a pivotal motor (not shown in the drawings) provided therein. The pivotal driving part 83 is capable of causing the nozzle arm 82 to pivot in the horizontal plane (XY plane).

FIG. 8 shows how the two-fluid nozzle 80 pivots. As shown in FIG. 8, the pivotal driving part 83 causes the nozzle arm 82 to pivot in the horizontal plane such that the discharge head 81 moves in an arcuate pattern between a processing position above a substrate W held on the spin chuck 20 and a standby position outside the processing cup 40. The position of the nozzle arm 82 indicated by dotted lines of FIG. 8 is determined when the discharge head 81 is at the processing position. The position of the nozzle arm 82 indicated by solid lines of FIG. 8 is determined when the discharge head 81 is at the standby position. Like in the aforementioned case of the upper processing solution nozzle 60, the pivotal movement of the nozzle arm 82 causing the discharge head 81 to move between the processing position and the standby position is also called the pivotal movement of the nozzle arm 82 between the processing position and the standby position.

As shown in FIG. 6, the base end of the nozzle arm 82 is coupled to the pivotal driving part 83 such that the nozzle arm 82 extends in the horizontal direction from the pivotal driving part 83. The tip end of the nozzle arm 82 extends downward in the pattern of a smooth circular arc. The discharge head 81 through which a processing solution is discharged onto a substrate W held on the spin chuck 20 is attached to the tip end of the nozzle arm 82 extending downward in the vertical direction (in the direction toward −Z side). The discharge head 81 is configured to receive a processing solution (in the first preferred embodiment, de-ionized water) supplied through the inner side of the nozzle arm 82 from a processing solution supplying mechanism provided in a place outside the drawings.

The support member 86 is interposed in the nozzle arm 82. The gas head 85 is attached to the support member 86 such that the gas head 85 and the discharge head 81 are arranged side by side. A pressurized inert gas (in the first preferred embodiment, nitrogen gas) is supplied to the gas head 85. While a processing solution is discharged from the discharge head 81 at the processing position, a pressurized inert gas is ejected from the gas head 85 to mix the inert gas into the processing solution discharged from the discharge head 81, thereby generating droplets of the processing solution. A mixed fluid of the droplets thereby generated and the inert gas is sprayed on the upper surface of a substrate W held on the spin chuck 20. Meanwhile, if the discharge head 81 is at the standby position outside the processing cup 40, the nozzle arm 82 is also on standby outside the processing cup 40 while extending in the X direction (see FIGS. 1 and 8).

The pivotal driving part 83 is attached to an up-and-down driving part 84. An up-and-down motor (not shown in the drawings) provided inside the up-and-down driving part 84 drives the up-and-down driving part 84. In response, the up-and-down driving part 84 causes the pivotal driving part 83, the discharge head 81, the gas head 85, and the nozzle arm 82 to move up and down together in the vertical direction.

An arm cleaning part 90 and an arm drying part 95 are provided near the standby position of the discharge head 81 and the nozzle arm 82. The arm cleaning part 90 has a shower nozzle 91. The shower nozzle 91 is fixedly provided at a position obliquely above the nozzle arm 82 at the standby position and closer to the spin chuck 20 (closer to +Y side) than the nozzle arm 82 at the standby position. The shower nozzle 91 extends in parallel to the nozzle arm 82 at the standby position, namely, extends in the X direction. The length of the shower nozzle 91 in the X direction is longer than the length of the nozzle arm 82 in the X direction. Further, the shower nozzle 91 is provided with a plurality of ejection holes arranged in the X direction. A cleaning solution ejected through the ejection holes is sprayed obliquely downward toward the two-fluid nozzle 80.

The shower nozzle 91 is configured to receive a cleaning solution (in the first preferred embodiment, de-ionized water) supplied from a cleaning solution supplying mechanism provided in a place outside the drawings. In response to supply of the cleaning solution to the shower nozzle 91, the cleaning solution is sprayed through the ejection holes of the shower nozzle 91 toward the two-fluid nozzle 80 arranged obliquely downward of the shower nozzle 91 (see FIGS. 6 to 8). As a result, the nozzle arm 82 of the two-fluid nozzle 80 is cleaned.

The arm drying part 95 has two drying gas nozzles 96. The drying gas nozzles 96 are fixedly provided at a position closer to −Y side than the nozzle arm 82 at the standby position, and at substantially the same height as the nozzle arm 82 at the standby position. The two drying gas nozzles 96 of the arm drying part 95 are arranged one above the other with a predetermined distance therebetween (see FIG. 6). Each of the drying gas nozzles 96 extends in the horizontal direction.

Drying gas nozzles 97 and 98 are provided in addition to the two drying gas nozzles 96. The drying gas nozzles 97 and 98 are arranged to face the support member 86 and the gas head 85 when the nozzle arm 82 is on standby at the standby position.

The two drying gas nozzles 96 and the drying gas nozzles 97 and 98 are configured to receive a drying gas (in the first preferred embodiment, nitrogen gas) supplied from a drying gas source provided in a place outside the drawings. In response to supply of the drying gas to the drying gas nozzles 96, the drying gas is ejected from the tip ends of the drying gas nozzles 96 and sprayed toward the two-fluid nozzle 80 (see FIGS. 6 and 8). The drying gas nozzles 96 are provided forward of the tip end of the nozzle arm 82 (closer to −X side than the tip end of the nozzle arm 82), so the drying gas is first sprayed on the tip end of the nozzle arm 82. In response to supply of the drying gas to the drying gas nozzles 97 and 98, the drying gas is further ejected from the tip ends of the drying gas nozzles 97 and 98 and sprayed toward the two-fluid nozzle 80.

In addition to the upper processing solution nozzle 60 and the two-fluid nozzle 80, a lower processing solution nozzle 28 is provided that extends in the vertical direction inside the rotary shaft 24 (see FIG. 2). An opening at the upper end of the lower processing solution nozzle 28 is placed at a position opposite the center of the lower surface of a substrate W held on the spin chuck 20. The lower processing solution nozzle 28 is also configured to receive processing solutions of several types. The processing solutions discharged from the lower processing solution nozzle 28 reach the lower surface of a substrate W held on the spin chuck 20.

As shown in FIGS. 1 and 2, the partition plate 15 divides the space inside the chamber 10 and surrounding the processing cup 40 into parts, one above the other. The partition plate 15 may be a single plate-like member surrounding the processing cup 40, or may be formed by joining a plurality of plate-like members together. Also, the partition plate 15 may be given a through hole passing through the partition plate 15 in the thickness direction or a notch. In the first preferred embodiment, the partition plate 15 is given through holes causing support shafts to pass therethrough that support the up-and-down driving parts 64 and 84 of the upper processing solution nozzle 60 and the two-fluid nozzle 80 respectively.

The outer circumferential edge of the partition plate 15 is coupled to the side wall 11 of the chamber 10. A peripheral portion of the partition plate 15 surrounding the processing cup 40 has a circular shape of a diameter larger than the outer diameter of the outer cup 43. So, the partition plate 15 will not prevent up and down movement of the outer cup 43.

An exhaust duct 18 is provided to part of the side wall 11 of the chamber 10 and at a position near the floor wall 13. The exhaust duct 18 is communicatively connected to an exhaust mechanism not shown in the drawings. Clean air is supplied from the fan filter unit 14 to flow down inside the chamber 10, and part of the clean air after passing through space between the processing cup 40 and the partition plate 15 is drawn out of the substrate processing apparatus 1 through the exhaust duct 18.

The hardware structure of the controller 3 in the substrate processing apparatus 1 is the same as that of a generally used computer. To be specific, the controller 3 includes a CPU responsible for various arithmetic operations, a ROM that is a read-only memory storing a basic program, a RAM that is a memory from and into which various information can be read and written freely, a magnetic disk storing control software and data, and the like. Execution of a predetermined processing program by the CPU of the controller 3 makes the controller 3 control each operating mechanism of the substrate processing apparatus 1, thereby realizing processing in the substrate processing apparatus 1.

The operation of the substrate processing apparatus 1 having the aforementioned structure is described next. Procedure generally taken by the substrate processing apparatus 1 to process a substrate W briefly includes predetermined process with a chemical solution by supplying a chemical solution onto a surface of the substrate W, subsequent rinsing process with de-ionized water by supplying de-ionized water to the substrate W, and then subsequent spin-drying process by causing the substrate W to rotate at high speed. For process of the substrate W, the substrate W is held on the spin chuck 20, and the processing cup 40 moves up and down. By way of example, for process with a chemical solution, only the outer cup 43 moves up to form an opening surrounding the substrate W held on the spin chuck 20 between the upper end portion 43b of the outer cup 43 and the upper end portion 52b of the second guide section 52 of the middle cup 42. In this condition, the substrate W is caused to rotate together with the spin chuck 20 while chemical solutions are supplied onto the upper and lower surfaces of the substrate W from the upper and lower processing solution nozzles 60 and 28 respectively. The upper processing solution nozzle 60 causes the nozzle arms 62 to pivot to move the discharge heads 61 to the processing position above the rotating substrate W held in a horizontal position on the spin chuck 20, thereby discharging the chemical solutions on the substrate W from the discharge heads 61. The chemical solutions thereby supplied are caused to flow over the upper and lower surfaces of the substrate W by centrifugal force generated by the rotation of the substrate W, and then scattered laterally from the peripheral edge portion of the substrate W, by which the process with a chemical solution of the substrate W proceeds. The chemical solutions scattered from the peripheral edge portion of the rotating substrate W are received by the upper end portion 43b of the outer cup 43, pass through the inner surface of the outer cup 43, and are then recovered in the outer recovery slot 51.

For rinsing process with de-ionized water, all the inner, middle and outer cups 41, 42 and 43 move up, for example, so that a substrate W held on the spin chuck 20 is surrounded by the first guide section 47 of the inner cup 41. In this condition, the substrate W is caused to rotate together with the spin chuck 20 while de-ionized water is supplied onto the upper and lower surfaces of the substrate W from the upper and lower processing solution nozzles 60 and 28 respectively. Like in the aforementioned process with a chemical solution, the upper processing solution nozzle 60 causes the nozzle arms 62 to pivot to move the discharge heads 61 to the processing position above the rotating substrate W held in a horizontal position on the spin chuck 20, thereby discharging de-ionized onto the substrate W from the discharge heads 61. The de-ionized water thereby supplied is caused to flow over the upper and lower surfaces of the substrate W by centrifugal force generated by the rotation of the substrate W, and then scattered laterally from the peripheral edge portion of the substrate W, by which the rising process with de-ionized water of the substrate W proceeds. The de-ionized water scattered from the peripheral edge portion of the rotating substrate W flows down along the inner wall of the first guide section 47, and then discharged through the disposal slot 49. In order for de-ionized water to be recovered in a path different from the path of recovery of a chemical solution, the middle and outer cups 42 and 43 may be caused to move up to form an opening surrounding a substrate W held on the spin chuck 20 between the upper end portion 52b of the second guide section 52 of the middle cup 42 and the upper end portion 47b of the first guide section 47 of the inner cup 41.

For spin-drying process, all the inner, middle and outer cups 41, 42 and 43 move down to place each of the upper end portion 47b of the first guide section 47 of the inner cup 41, the upper end portion 52b of the second guide section 52 of the middle cup 42, and the upper end portion 43b of the outer cup 43 below a substrate W held on the spin chuck 20. In this condition, the substrate W is caused to rotate together with the spin chuck 20 at high speed to blow water droplets off the substrate W by using centrifugal force, thereby realizing the drying process.

In the aforementioned surface process realized by supplying a processing solution onto a substrate W, while most of the processing solution scattered from the rotating substrate W is recovered in the processing cup 40, part of the processing solution is converted into mist form and such processing solution in mist form may be scattered as far as to the outside of the processing cup 40. The processing solution scattered outside of the processing cup 40 is attached to the outer upper surface of the processing cup 40 and the upper surface of the partition plate 15, and additionally, to the nozzle arms 62 of the upper processing solution nozzle 60 and the nozzle arm 82 of the two-fluid nozzle 80. If the processing solution attached to the nozzle arms 62 and 82 remains unremoved, it may drop onto the upper surface of a substrate W (such a phenomenon is what is called dripping) when the nozzle arms 62 and 82 have moved to their processing positions to become a source of pollution. Or, the nozzle arms 62 and 82 may generate particles after the processing solution attached to the nozzle arms 62 and 82 is dried.

In response, in the first preferred embodiment, the nozzle arms 62 of the upper processing solution nozzle 60 and the nozzle arm 82 of the two-fluid nozzle 80 are cleaned in the following manner. The nozzle arms 62 and 82 are cleaned in an interval between completion of process of one lot and start of process of a next lot, for example. The nozzle arms 62 and 82 are cleaned in an interval between processing lots, and preferably, after cleaning of an outer upper surface 43d of the processing cup 40 and subsequent cleaning the upper surface of the partition plate 15. The reason therefor is that, if the partition plate 15 and the processing cup 40 are cleaned after cleaning of the nozzle arms 62 and 82, a product such as mist generated as a result of cleaning of the partition plate 15 and the processing cup 40 may be attached again to the nozzle arms 62 and 82.

For cleaning of the three nozzle arms 62 of the upper processing solution nozzle 60, the pivotal driving part 63 moves the three nozzle arms 62 and the three discharge heads 61 to the standby position outside the processing cup 40, and the nozzle arms 62 are cleaned at the standby position. The standby position is a position determined irrespective of the height of the nozzle arms 62, and is a destination of the three nozzle arms 62 caused to move by the pivotal movement of the pivotal driving part 63. So, the discharge heads 61 and the nozzle arms 62 are allowed to move up and down at the standby position by the up-and-down driving part 64.

A cleaning solution is ejected from the shower nozzle 71 of the arm cleaning part 70 while the nozzle arms 62 and the discharge heads 61 are at the standby position. The cleaning solution ejected from the shower nozzle 71 flows obliquely downward toward +X side. The cleaning solution ejected from the shower nozzle 71 is sprayed on the nozzle arms 62 of the upper processing solution nozzle 60, thereby cleaning the nozzle arms 62.

The shower nozzle 71 is provided with a plurality of ejection holes arranged in a line, and jets of the cleaning solution are discharged in a line through the ejection holes. Meanwhile, the upper processing solution nozzle 60 has the three parallel nozzle arms 62 arranged in parallel to each other in the horizontal direction and connected to the pivotal driving part 63. So, it is hard to wash the three nozzle arms 62 simultaneously with the jets of the cleaning solution discharged in a line.

In response, in the first preferred embodiment, the up-and-down driving part 64 causes the nozzle arms 62 to move up and down such that the nozzle arms 62 cut across jets of a cleaning solution discharged obliquely downward from the shower nozzle 71. FIG. 9 schematically shows how the three nozzle arms 62 are cleaned while being caused to move up and down. While a cleaning solution is discharged obliquely downward from the fixedly placed shower nozzle 71 as shown by a dotted line of FIG. 9, the up-and-down driving part 64 causes the three nozzle arms 62 to move up and down at the standby position. If the three nozzle arms 62 are at a height L1, one of the three nozzle arms 62 closest to +X side is cleaned with the cleaning solution sprayed thereon. If the up-and-down driving part 64 causes the three nozzle arms 62 to move up from the height L1 to a height L2, one of the three nozzle arms 62 at the center reaches a position where flows of the cleaning solution are formed. Then, the nozzle arm 62 at the center is cleaned with the cleaning solution sprayed thereon. If the up-and-down driving part 64 causes the three nozzle arms 62 to move further up from the height L2 to a height L3, one of the three nozzle arms 62 closest to −X side reaches a position where flows of the cleaning solution are formed. Then, the nozzle arm 62 closest to −X side is cleaned with the cleaning solution sprayed thereon.

As described above, the up-and-down driving part 64 causes the nozzle arms 62 to move up and down such that the nozzle arms 62 cut across jets of a cleaning solution discharged obliquely downward from the shower nozzle 71. As a result, all the three nozzle arms 62 can be cleaned in order with the cleaning solution ejected from one shower nozzle 71.

The length of a line of the ejection holes of the shower nozzle 71 in the Y direction is longer than the length of the nozzle arms 62 in the Y direction. So, the nozzle arms 62 are entirely cleaned with a cleaning solution ejected obliquely downward from the shower nozzle 71. This makes it possible to clean parts of the nozzle arms 62 reliably that are to face a substrate W held on the spin chuck 20, namely parts of the nozzle arms 62 to reach a position above the substrate W when the discharge heads 61 have moved to the processing position.

The shower nozzle 71 ejects a cleaning solution obliquely downward toward +X side, namely, ejects a cleaning solution in a direction away from the spin chuck 20 holding a substrate W thereon. Thus, a mist of the cleaning solution generated by spraying the cleaning solution on the nozzle arms 62 and the like is scattered toward the side wall 11 of the chamber 10, and is hardly attached to the spin chuck 20. So, cleaning of the nozzle arms 62 of the upper processing solution nozzle 60 will not pollute the spin chuck 20.

The up-and-down driving part 64 causes the three nozzle arms 62 to move up and down while the shower nozzle 71 discharges a cleaning solution obliquely downward, thereby cleaning the nozzle arms 62. After cleaning of all the three nozzle arms 62 is finished, ejection of the cleaning solution from the shower nozzle 71 is stopped. Then, the three nozzle arms 62 are dried.

For drying process of the three nozzle arms 62 of the upper processing solution nozzle 60, the three nozzle arms 62 and the discharge heads 61 are also at the standby position, and the nozzle arms 62 are dried at the standby position. A drying gas (nitrogen gas) ejected from the two drying gas nozzles 76 of the arm drying part 75 is sprayed toward the nozzle arms 62 at the standby position. The drying gas is ejected toward −Y side in the horizontal direction. The drying gas ejected from the drying gas nozzles 76 is sprayed on the nozzle arms 62 of the upper processing solution nozzle 60, thereby removing a cleaning solution left on the nozzle arms 62 after cleaning to dry the nozzle arms 62.

As shown in FIG. 3, the two drying gas nozzles 76 of the arm drying part 75 are arranged one above the other with a predetermined distance therebetween. The up-and-down driving part 64 controls the height of the nozzle arms 62 such that a drying gas from the upper drying gas nozzle 76 is sprayed on portions of the nozzle arms 62 extending in the horizontal direction, and that the drying gas from the lower drying gas nozzle 76 is sprayed on portions of the nozzle arms 62 extending downward in the pattern of a smooth circular arc. Thus, the drying gas is sprayed on the entire nozzle arms 62, so that at least parts of the nozzle arms 62 having received a cleaning solution ejected from the shower nozzle 71 are dried as a result of spraying with the drying gas.

The two drying gas nozzles 76 arranged one above the other with a predetermined distance therebetween are capable of ejecting a drying gas to be sprayed entirely on one nozzle arm 62, but they find difficulty in ejecting a drying gas to be sprayed on the three nozzle arms 62 simultaneously connected to the pivotal driving part 63.

In response, in the first preferred embodiment, the pivotal driving part 63 causes the nozzle arms 62 to swing such that the nozzle arms 62 cut across jets of a drying gas discharged in the horizontal direction from the drying gas nozzles 76. FIG. 10 schematically shows how the three nozzle arms 62 are dried while being caused to swing. While a drying gas is ejected toward −Y side in the horizontal direction from the fixedly placed drying gas nozzles 76, the pivotal driving part 63 causes the three nozzle arms 62 to swing in the horizontal plane, thereby spraying the drying gas from the drying gas nozzles 76 on the three nozzle arms 62 in order. As a result, all the three nozzle arms 62 of the upper processing solution nozzle 60 can be dried by spraying with the drying gas. For drying of the nozzle arms 62, the pivotal driving part 63 causes the nozzle arms 62 to swing to an angle that makes all the three nozzle arms 62 cut across jets of the drying gas discharged from the drying gas nozzles 76.

The drying gas nozzles 76 are arranged forward of the tip ends of the nozzle arms 62 (closer to +Y side than the tip ends of the nozzle arms 62), so a drying gas is first sprayed on the tip ends of the nozzle arms 62. So, if a cleaning solution attached to the nozzle arms 62 is blown off by spraying with a drying gas, the cleaning solution travels toward the base ends of the nozzle arms 62 (toward −Y side). Thus, droplets of the cleaning solution will not be attached to the discharge heads 61 and the tip ends of the nozzle arms 62. This makes it possible to maintain the cleanliness of parts of the nozzle arms 62 to face a substrate W held on the spin chuck 20 when the discharge heads 61 have moved to the processing position.

The pivotal driving part 63 causes the three nozzle arms 62 to swing in the horizontal plane while the drying gas nozzles 76 eject a drying gas in the horizontal direction, thereby drying the nozzle arms 62. After drying of all the three nozzle arms 62 is finished, ejection of the drying gas from the drying gas nozzles 76 is stopped. Then, the cleaning and drying processes of the nozzle arms 62 of the upper processing solution nozzle 60 are completed.

In the first preferred embodiment, even if a processing solution is attached to the nozzle arms 62 of the upper processing solution nozzle 60, a cleaning solution is ejected from the shower nozzle 71 onto the nozzle arms 62 to clean the nozzle arms 62. Then, a drying gas is ejected from the drying gas nozzles 76 to dry the nozzle arms 62 and remove the processing solution attached to the nozzle arms 62. Thus, the processing solution attached to the nozzle arms 62 does not remain unremoved, so that it will not become a source of pollution.

Further, in the first preferred embodiment, the shower nozzle 71 for ejecting a cleaning solution and the drying gas nozzles 76 for ejecting a drying gas are fixedly provided. If attached to the upper processing solution nozzle 60 itself for putting the shower nozzle 71 and the drying gas nozzles 76 into operation, piping to supply fluids (here, a cleaning solution and a drying gas) to the shower nozzle 71 and the drying gas nozzles 76 should be movable. In this case, constraints on the piping are unavoidable in terms of installation space thereof, interference with the upper processing solution nozzle 60, and the like. If the shower nozzle 71 and the drying gas nozzles 76 are fixedly placed, piping to supply fluids to the shower nozzle 71 and the drying gas nozzles 76 can be fixed, so that the piping becomes free from such constraints.

The nozzle arm 82 of the two-fluid nozzle 80 is cleaned and dried in substantially the same manner as the upper processing solution nozzle 60. To be specific, a cleaning solution is ejected from the shower nozzle 91 toward the nozzle arm 82 at the standby position to clean the nozzle arm 82. More specifically, the up-and-down driving part 84 causes the nozzle arm 82 to move up and down such that the nozzle arm 82 cuts across jets of a cleaning solution discharged obliquely downward toward −Y side from the shower nozzle 91.

The two-fluid nozzle 80 has one nozzle arm 82. So, unlike the upper processing solution nozzle 60, the nozzle arm 82 is not necessarily required to move up and down. However, in order to clean the support member 86 branching off the nozzle arm 82 reliably, it is preferable that the nozzle arm 82 be caused to move up and down in response to jets of a cleaning solution discharged obliquely downward as described above. The up-and-down driving part 84 causes the nozzle arm 82 to move up and down such that the nozzle arm 82 cuts across jets of a cleaning solution discharged obliquely downward from the shower nozzle 91. As a result, both the nozzle arm 82 and the support member 86 can be cleaned in order with a cleaning solution ejected from one shower nozzle 91.

The length of a line of the ejection holes of the shower nozzle 91 in the X direction is longer than the length of the nozzle arm 82 in the X direction. So, the nozzle arm 82 is entirely cleaned with a cleaning solution ejected obliquely downward from the shower nozzle 91. This makes it possible to clean part of the nozzle arm 82 reliably that is to face a substrate W held on the spin chuck 20 when the discharge head 81 has moved to the processing position. The support member 86 also faces a substrate W held on the spin chuck 20 when the discharge head 81 has moved to the processing position. The support member 86 is cleaned by causing the nozzle arm 82 to move up and down in response to jets of a cleaning solution discharged obliquely downward as described above.

The shower nozzle 91 ejects a cleaning solution obliquely downward toward −Y side, namely, ejects a cleaning solution in a direction away from the spin chuck 20 holding a substrate W thereon. Thus, a mist of the cleaning solution generated by spraying the cleaning solution on the nozzle arm 82 and the like is scattered toward the side wall 11 of the chamber 10, and is hardly attached to the spin chuck 20. So, cleaning of the nozzle arm 82 of the two-fluid nozzle 80 will not pollute the spin chuck 20.

For drying process of the nozzle arm 82, a drying gas is ejected from the two drying gas nozzles 96 of the arm drying part 95 and sprayed on the nozzle arm 82 at the standby position. So, at least part of the nozzle arm 82 having received a cleaning solution ejected from the shower nozzle 91 is dried as a result of spraying with the drying gas. The drying gas is also ejected from the drying gas nozzles 97 and 98 and sprayed toward the support member 86 and the gas head 85, thereby removing a cleaning solution attached to the support member 86 and the gas head 85 to dry the support member 86 and the gas head 85.

Like in the case of the upper processing solution nozzle 60, the nozzle arm 82 of the two-fluid nozzle 80 may also be dried while the pivotal driving part 83 causes the nozzle arm 82 to swing such that the nozzle arm 82 cuts across jets of a drying gas discharged in the horizontal direction from the fixedly placed drying gas nozzles 96. This makes it possible to spray the drying gas reliably on both the nozzle arm 82 and the support member 86 to dry the nozzle arm 82 and the support member 86.

In the first preferred embodiment, even if a processing solution is attached to the nozzle arm 82 of the two-fluid nozzle 80, a cleaning solution is ejected from the shower nozzle 91 onto the nozzle arm 82 to clean the nozzle arm 82. Then, a drying gas is ejected from the drying gas nozzles 96 to dry the nozzle arm 82 and remove the processing solution attached to the nozzle arm 82. Thus, the processing solution attached to the nozzle arm 82 does not remain unremoved, so that it will not become a source of pollution.

Further, in the first preferred embodiment, the shower nozzle 91 for ejecting a cleaning solution and the drying gas nozzles 96 for ejecting a drying gas are fixedly provided. So, piping to supply fluids to the shower nozzle 91 and the drying gas nozzles 96 can be fixedly placed. Thus, the piping is free from constraints to be imposed by attaching the shower nozzle 91 and the drying gas nozzles 96 to the two-fluid nozzle 80 for putting the shower nozzle 91 and the drying gas nozzles 96 into operation (the same constraints as those to be imposed if the shower nozzle 71 and the drying gas nozzles 76 are attached to the upper processing solution nozzle 60).

Second Preferred Embodiment

A second preferred embodiment of the present invention is described next. The structure of a substrate processing apparatus and procedure taken to process a substrate W of the second preferred embodiment are the same as those of the first preferred embodiment. Like in the first preferred embodiment, during surface process of a substrate W by supplying a processing solution to the substrate W, most of the processing solution scattered from the rotating substrate W is recovered in the processing cup 40. However, part of the processing solution is converted into mist form and such processing solution in mist form may be scattered as far as to the outside of the processing cup 40. The processing solution scattered outside of the processing cup 40 is attached to the outer upper surface of the processing cup 40 and the upper surface of the partition plate 15, and additionally, to the nozzle arms 62 of the upper processing solution nozzle 60 and the nozzle arm 82 of the two-fluid nozzle 80. In particular, when a processing solution is discharged onto a substrate W, the nozzle arms 62 of the upper processing solution nozzle 60 or the nozzle arm 82 of the two-fluid nozzle 80 has moved to the processing position above the substrate W. So, the processing solution is easily attached to the nozzle arms 62 or the nozzle arm 82. If the processing solution attached to the nozzle arms 62 or 82 remains unremoved, it may drop onto the upper surface of a substrate W to be processed next (such a phenomenon is what is called dripping) when the nozzle arms 62 or 82 has moved to the processing position to process this substrate W. In this case, the processing solution may become a source of pollution.

So, in the second preferred embodiment, the nozzle arms 62 of the upper processing solution nozzle 60 and the nozzle arm 82 of the two-fluid nozzle 80 are dried in the following manner to prevent a processing solution from remaining unremoved on the arms. It is preferable that the arms be dried each time the discharge heads 61 (or the discharge head 81) have moved back from the processing position to the standby position after process of discharging a processing solution onto one substrate W is finished. If the nozzle arms 62 and 82 are dried after process of one substrate W is finished, a processing solution attached to the arms after being discharged onto a substrate W will not become a source of pollution during process of a next substrate W.

For drying process of the three nozzle arms 62 of the upper processing solution nozzle 60, the three nozzle arms 62 and the discharge heads 61 have been caused by the pivotal driving part 63 to move to the standby position outside the processing cup 40. To be specific, the nozzle arms 62 are dried at the standby position when the discharge heads 61 have moved back from the processing position to the standby position after process of one substrate W is finished. The standby position is a position determined irrespective of the height of the nozzle arms 62, and is a destination of the three nozzle arms 62 caused to move by the pivotal movement of the pivotal driving part 63. The standby position may have a range that allows the nozzle arms 62 to pivot to an angle of some degrees in the horizontal plane as long as the standby position is outside the processing cup 40.

During drying process, a drying gas (nitrogen gas) ejected from the two drying gas nozzles 76 of the arm drying part 75 is sprayed on the three nozzle arms 62 having moved back to the standby position. The drying gas is ejected toward −Y side in the horizontal direction from the drying gas nozzles 76. The drying gas ejected from the drying gas nozzles 76 is sprayed on the nozzle arms 62 of the upper processing solution nozzle 60. As a result, the nozzle arms 62 on which a processing solution remains unremoved after process of a substrate W are dried and the processing solution attached to the nozzle arms 62 is removed.

As shown in FIG. 3, the two drying gas nozzles 76 of the arm drying part 75 are arranged one above the other with a predetermined distance therebetween. The up-and-down driving part 64 controls the height of the nozzle arms 62 such that a drying gas from the upper drying gas nozzle 76 is sprayed on portions of the nozzle arms 62 extending in the horizontal direction, and that the drying gas from the lower drying gas nozzle 76 is sprayed on portions of the nozzle arms 62 extending downward in the pattern of a smooth circular arc. Thus, the drying gas is sprayed on the entire nozzle arms 62. This makes it possible to spray a drying gas reliably on at least parts of the nozzle arms 62 to face a substrate W held on the spin chuck 20, namely parts of the nozzle arms 62 to reach a position above the substrate W when the discharge heads 61 have moved to the processing position, thereby drying these parts of the nozzle arms 62.

The two drying gas nozzles 76 arranged one above the other with a predetermined distance therebetween are capable of ejecting a drying gas entirely on one nozzle arm 62, but they find difficulty in ejecting a drying gas to be sprayed on the three nozzle arms 62 simultaneously connected to the pivotal driving part 63.

In response, in the second preferred embodiment, the pivotal driving part 63 causes the nozzle arms 62 to swing such that the tip ends of the nozzle arms 62 cut across jets of a drying gas discharged in the horizontal direction from the fixedly placed drying gas nozzles 76. As shown in FIG. 10, while a drying gas is ejected toward −Y side in the horizontal direction from the fixedly placed drying gas nozzles 76, the pivotal driving part 63 causes the three nozzle arms 62 to swing in the horizontal plane, thereby spraying the drying gas from the drying gas nozzles 76 on the three nozzle arms 62 in order. As a result, all the three nozzle arms 62 of the upper processing solution nozzle 60 can be dried by spraying with the drying gas. For drying of the nozzle arms 62, the pivotal driving part 63 causes the nozzle arms 62 to swing to an angle that makes all the three nozzle arms 62 cut across jets of the drying gas discharged from the drying gas nozzles 76. This angle corresponds to a range of movement of the nozzle arms 62 at the standby position, so the nozzle arms 62 are caused to swing within the standby position.

The drying gas nozzles 76 are arranged forward of the tip ends of the nozzle arms 62 (closer to +Y side than the tip ends of the nozzle arms 62) at the standby position, so a drying gas is first sprayed on the tip ends of the nozzle arms 62 when the discharge heads 61 are at the standby position. So, if a cleaning solution attached to the nozzle arms 62 is blown off by spraying with a drying gas, the cleaning solution travels toward the base ends of the nozzle arms 62 (toward −Y side). Thus, droplets of the cleaning solution will not be attached to the discharge heads 61 and the tip ends of the nozzle arms 62. This makes it possible to maintain the cleanliness of parts of the nozzle arms 62 to face a substrate W held on the spin chuck 20 when the discharge heads 61 have moved to the processing position.

The pivotal driving part 63 causes the three nozzle arms 62 to swing in the horizontal plane while the drying gas nozzles 76 eject a drying gas in the horizontal direction, thereby drying the nozzle arms 62. After drying of all the three nozzle arms 62 is finished, ejection of the drying gas from the drying gas nozzles 76 is stopped. Then, the drying process of the nozzle arms 62 of the upper processing solution nozzle 60 is completed. Process of a next substrate W is started thereafter.

In the second preferred embodiment, even if a processing solution is attached to the nozzle arms 62 of the upper processing solution nozzle 60 during process of a substrate W, a drying gas is ejected from the drying gas nozzles 76 and sprayed on the nozzle arms 62 to dry the nozzle arms 62 and remove the processing solution attached to the nozzle arms 62. Thus, pollution will not be caused by the nozzle arms 62 having received a processing solution during process of a substrate W.

In particular, each time the discharge heads 61 have moved back from the processing position to the standby position after process of discharging a processing solution onto one substrate W is finished, a drying gas is sprayed on the nozzle arms 62 to dry the nozzle arms 62. Thus, the nozzle arms 62 having received a processing solution during process of one substrate W will not pollute a substrate W to be processed next.

Further, in the second preferred embodiment, the drying gas nozzles 76 for ejecting a drying gas are fixedly provided. If attached to the upper processing solution nozzle 60 itself for putting the drying gas nozzles 76 operation, piping to supply a drying gas to the drying gas nozzles 76 should be movable. In this case, constraints on the piping are unavoidable in terms of installation space thereof, interference with the upper processing solution nozzle 60, and the like. If the drying gas nozzles 76 are fixedly placed, piping to supply a fluid to the drying gas nozzles 76 can be fixed, so that the piping becomes free from such constraints.

The nozzle arm 82 of the two-fluid nozzle 80 is dried in substantially the same manner as that of the upper processing solution nozzle 60. To be specific, when the discharge head 81 has moved back from the processing position to the standby position after process of one substrate W is finished, the nozzle arm 82 is dried at the standby position. The nozzle arm 82 is dried by spraying of a drying gas ejected from the two drying gas nozzles 96 of the arm drying part 95 on the nozzle arm 82 having moved back to the standby position. The drying gas is ejected in the horizontal direction toward +X side from the drying gas nozzles 96. The drying gas ejected from the drying gas nozzles 96 is sprayed on the nozzle arm 82 of the two-fluid nozzle 80. As a result, the nozzle arm 82 on which a processing solution remains unremoved after process of a substrate W is dried and the processing solution attached to the nozzle arms 82 is removed. The drying gas is also ejected from the drying gas nozzles 97 and 98 and sprayed toward the support member 86 and the gas head 85, thereby removing a cleaning solution attached to the support member 86 and the gas head 85 to dry the support member 86 and the gas head 85.

As shown in FIG. 6, the two drying gas nozzles 96 of the arm drying part 95 are arranged one above the other with a predetermined distance therebetween. The up-and-down driving part 84 controls the height of the nozzle arm 82 such that a drying gas from the upper drying gas nozzle 96 is sprayed on a portion of the nozzle arm 82 extending in the horizontal direction, and that the drying gas from the lower drying gas nozzle 96 is sprayed on a portion of the nozzle arm 82 extending downward in the pattern of a smooth circular arc. Thus, the drying gas is sprayed on the entire nozzle arm 82. This makes it possible to spray a drying gas reliably on at least part of the nozzle arm 82 to face a substrate W held on the spin chuck 20, namely part of the nozzle arm 82 to reach a position above the substrate W when the discharge head 81 has moved to the processing position, thereby drying this part of the nozzle arm 82.

Figure 11:
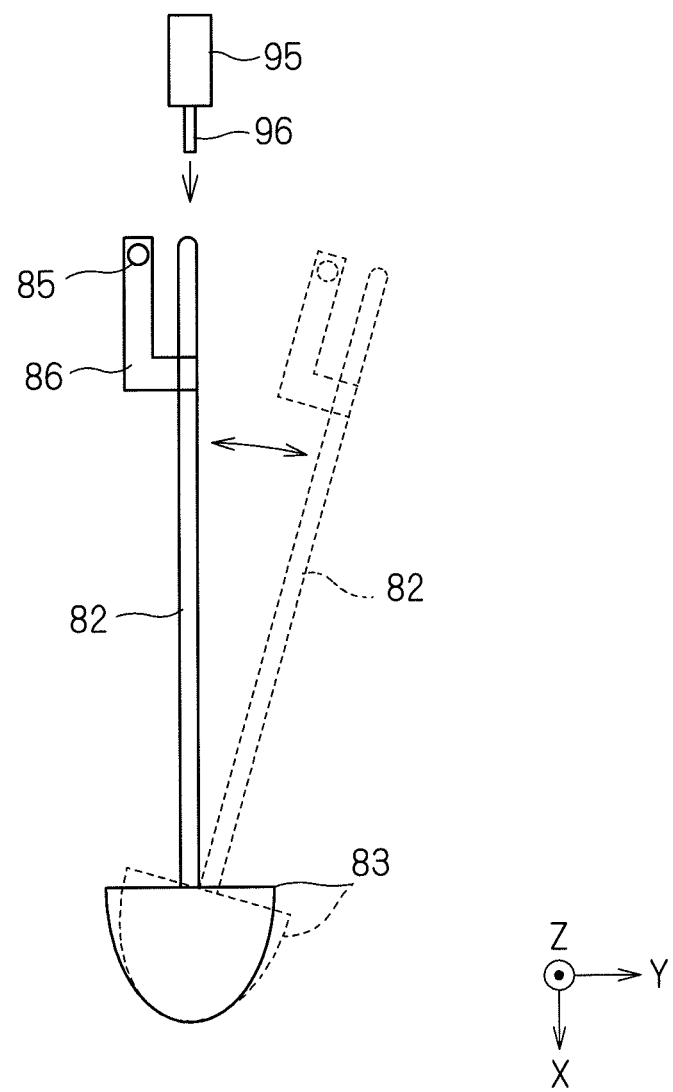
FIG. 11 schematically shows how a nozzle arm of the two-fluid nozzle is dried while being caused to swing.

Like the aforementioned drying process of the upper processing solution nozzle 60, the nozzle arm 82 of the two-fluid nozzle 80 is dried while the pivotal driving part 83 causes the nozzle arm 82 to swing such that the tip end of the nozzle arm 82 cuts across jets of a drying gas discharged in the horizontal direction from the fixedly placed drying gas nozzles 96. FIG. 11 schematically shows how the nozzle arm 82 of the two-fluid nozzle 80 is dried while being caused to swing. While a drying gas is ejected toward +X side in the horizontal direction from the fixedly placed drying gas nozzles 96, the pivotal driving part 83 causes the nozzle arm 82 to swing in the horizontal plane, thereby spraying the drying gas from the drying gas nozzles 96 on the nozzle arm 82 and the support member 86 in order. As a result, both the nozzle arm 82 and the support member 86 of the two-fluid nozzle 80 can be dried by spraying with the drying gas. For drying of the nozzle arm 82, the pivotal driving part 83 causes the nozzle arm 82 to swing to an angle that makes both the nozzle arm 82 and the support member 86 cut across jets of the drying gas discharged from the drying gas nozzles 96. This angle corresponds to a range of movement of the nozzle arm 82 at the standby position, so the nozzle arm 82 is caused to swing within the standby position.

The drying gas nozzles 96 are arranged forward of the tip end of the nozzle arm 82 (closer to −X side than the tip end of the nozzle arm 82) at the standby position, so a drying gas is first sprayed on the tip end of the nozzle arm 82 when the discharge head 81 is at the standby position. So, if a processing solution attached to the nozzle arm 82 is blown off by spraying with a drying gas, the processing solution travels toward the base end of the nozzle arm 82 (toward +X side). Thus, droplets of the processing solution will not be attached to the discharge head 81, the gas head 85, and the tip end of the nozzle arm 82. This makes it possible to maintain the cleanliness of part of the nozzle arm 82 to face a substrate W held on the spin chuck 20 when the discharge head 81 has moved to the processing position.

The pivotal driving part 83 causes the nozzle arm 82 to swing in the horizontal plane while the drying gas nozzles 96 eject a drying gas in the horizontal direction, thereby drying the nozzle arm 82. After drying of the nozzle arm 82 is finished, ejection of the drying gas from the drying gas nozzles 96 is stopped. Then, the drying process of the nozzle arm 82 of the two-fluid nozzle 80 is completed. Process of a next substrate W is started thereafter.

In the second preferred embodiment, even if a processing solution is attached to the nozzle arm 82 of the two-fluid nozzle 80 during process of a substrate W, a drying gas is ejected from the drying gas nozzles 96 and sprayed on the nozzle arm 82. As a result, the nozzle arm 82 is dried and the processing solution attached to the nozzle arm 82 is removed. Thus, pollution will not be caused by the nozzle arm 82 having received a processing solution during process of a substrate W.

In particular, each time the discharge head 81 has moved back from the processing position to the standby position after process of discharging a processing solution onto one substrate W is finished, a drying gas is sprayed on the nozzle arm 82 to dry the nozzle arm 82. Thus, the nozzle arm 82 having received a processing solution during process of one substrate W will not pollute a substrate W to be processed next.

Further, in the second preferred embodiment, the drying gas nozzles 96 for ejecting a drying gas are fixedly provided. If attached to the two-fluid nozzle 80 itself for putting the drying gas nozzles 96 into operation, piping to supply a drying gas to the drying gas nozzles 96 should be movable. In this case, constraints on the piping are unavoidable in terms of installation space thereof, interference with the two-fluid nozzle 80, and the like. If the drying gas nozzles 96 are fixedly placed, piping to supply a fluid to the drying gas nozzles 96 can be fixed, so that the piping becomes free from such constraints.

Third Preferred Embodiment

A third preferred embodiment of the present invention is described next. FIG. 12 is a plan view of a substrate processing apparatus 1a of the third preferred embodiment. The elements same as those of the first preferred embodiment are identified by the same reference numbers in FIG. 12, and will not be described in detail again. The vertical sectional view of the substrate processing apparatus 1a is the same as that of FIG. 2. The substrate processing apparatus 1a of the third preferred embodiment also employs a single-wafer system of processing semiconductor substrates W one by one. The substrate processing apparatus 1a performs process with a chemical solution and rinsing process with de-ionized water on a circular silicon substrate W, and then performs drying process on the substrate W.

Figure 14:
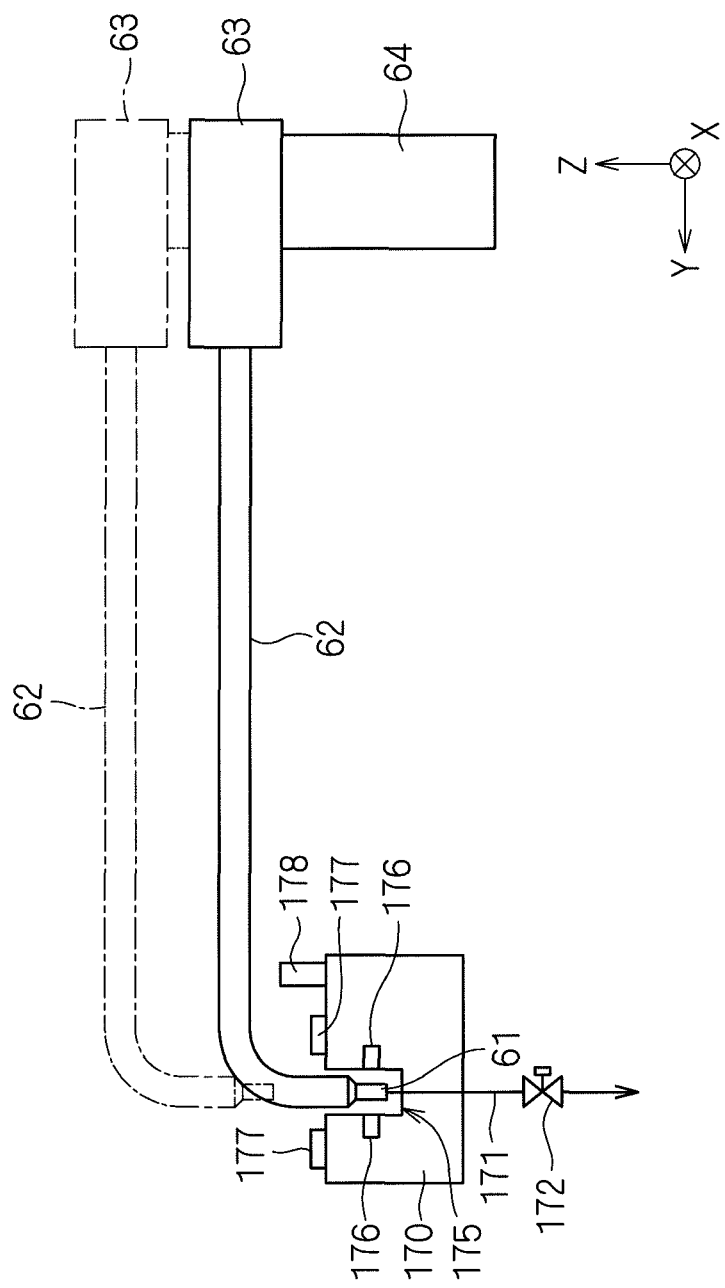
FIG. 14 is a schematic side view of the upper processing solution nozzle and a standby pot.

FIG. 13 is a plan view schematically showing the operation of an upper processing solution nozzle 60. FIG. 14 is a schematic side view of the upper processing solution nozzle 60 and a standby pot 170. Like in the first preferred embodiment, the upper processing solution nozzle 60 is composed of three parallel nozzle arms 62, and discharge heads 61 attached to the tip ends of the corresponding nozzle arms 62. The base ends of the three nozzle arms 62 are coupled to a pivotal driving part 63. The three nozzle arms 62 are coupled to the pivotal driving part 63 such that the nozzle arms 62 are arranged in parallel to each other in the horizontal direction. The pivotal driving part 63 is arranged outside a processing cup 40. The pivotal driving part 63 is capable of making pivotal movement about an axis extending in the vertical direction caused by a pivotal motor (not shown in the drawings) provided therein. The pivotal driving part 63 is capable of causing the three nozzle arms 62 to pivot together in the horizontal plane (XY plane).

As shown in FIG. 13, the pivotal driving part 63 causes the nozzle arms 62 to pivot in the horizontal plane such that the discharge heads 61 move in an arcuate pattern between a processing position above a substrate W held on the spin chuck 20 and a standby position outside the processing cup 40. The positions of the three nozzle arms 62 indicated by dotted lines of FIG. 13 are determined when the discharge heads 61 are at the processing position. The positions of the three nozzle arms 62 indicated by solid lines of FIG. 13 are determined when the discharge heads 61 are at the standby position. The pivotal movement of the nozzle arms 62 causing the discharge heads 61 to move between the processing position and the standby position is also called the pivotal movement of the nozzle arms 62 between the processing position and the standby position.

As shown in FIG. 14, the base end of each of the three nozzle arms 62 is coupled to the pivotal driving part 63 such that the nozzle arm 62 extends in the horizontal direction from the pivotal driving part 63. The tip end of each of the nozzle arms 62 extends downward in the pattern of a smooth circular arc. The discharge heads 61 through which a processing solution is discharged onto a substrate W held on the spin chuck 20 are attached to the tip ends of the corresponding nozzle arms 62 extending downward in the vertical direction (in the direction toward −Z side). The discharge heads 61 are configured to receive processing solutions of several types (including at least de-ionized water) supplied through the inner sides of the nozzle arms 62 from a processing solution supplying mechanism provided in a place outside the drawings. The processing solutions supplied to the discharge heads 61 are discharged from the discharge heads 61 downward in the vertical direction. The processing solutions discharged from the discharge heads 61 at the processing position above a substrate W held on the spin chuck 20 reach the upper surface of the substrate W. Meanwhile, if the discharge heads 61 are at the standby position outside the processing cup 40, the nozzle arms 62 are also on standby outside the processing cup 40 while extending in the Y direction (see FIGS. 12 and 13).

The pivotal driving part 63 is attached to an up-and-down driving part 64. An up-and-down motor (not shown in the drawings) provided inside the up-and-down driving part 64 drives the up-and-down driving part 64. In response, the up-and-down driving part 64 causes the pivotal driving part 63, the three discharge heads 61, and the three nozzle arms 62 to move up and down together in the vertical direction.

The standby pot 170 is placed at the standby position of the discharge heads 61. The standby pot 170 has a housing part 175 in the form of a recess. The standby pot 170 houses the discharge heads 61 of the upper processing solution nozzle 60 in the housing part 175 when the discharge heads 61 are at the standby position. Immediately before supplying a processing solution onto a substrate W, the discharge heads 61 discharge a processing solution of a predetermined amount into the housing part 175 of the standby pot 170 (pre-dispensing). The processing solution to be discharged here is deteriorated or reduced in temperature as it has stayed in the discharge heads 61 for a fixed period of time or longer. The housing part 175 of the standby pot 170 may be horizontally elongated for housing the three discharge heads 61 together. Or, three housing sections 175 may be provided in which the corresponding three discharge heads 61 are housed separately.

A disposal line 171 is connected to a bottom portion of the housing part 175. A disposal valve 172 is interposed in the disposal line 171. Opening the disposal valve 172 allows drainage of a solution in the housing part 175 to the outside through the disposal line 171.

A cleaning solution ejecting part 176 is provided to the housing part 175 of the standby pot 170. The cleaning solution ejecting part 176 is fixedly placed on a side wall of the housing part 175. The cleaning solution ejecting part 176 is provided with a plurality of ejection holes pointed toward the inner side of the housing part 175. The cleaning solution ejecting part 176 is configured to receive a cleaning solution (in the third preferred embodiment, de-ionized water) supplied from a cleaning solution supplying mechanism provided in a place outside the drawings. The cleaning solution supplied from the cleaning solution supplying mechanism is ejected toward the inner side of the housing part 175 through the ejection holes of the cleaning solution ejecting part 176. The cleaning solution ejecting part 176 is not limited to a member with a plurality of ejection holes, but various publicly known mechanisms including a discharge nozzle capable of ejecting a solution are applicable as the cleaning solution ejecting part 176.

A drying gas ejecting part 177 is provided on the upper surface of the standby pot 170 and near an upper opening of the housing part 175. The drying gas ejecting part 177 is provided with a plurality of ejection holes pointed toward the upper opening and its vicinities of the housing part 175 located obliquely downward of the drying gas ejecting part 177. The drying gas ejecting part 177 is configured to receive a drying gas (in the third preferred embodiment, nitrogen ($N_2$) gas) supplied from a drying gas source provided in a place outside the drawings. The drying gas supplied from the drying gas source is ejected toward the upper opening and its vicinities of the housing part 175 through the ejection holes of the drying gas ejecting part 177. The drying gas ejecting part 177 is not limited to a member with a plurality of ejection holes, but various publicly known mechanisms including a gas nozzle capable of ejecting gas are applicable as the drying gas ejecting part 177.

The standby pot 170 further includes an arm drying part 178. The arm drying part 178 is placed on the upper surface of the standby pot 170 and at a position closer to the base ends of the nozzle arms 62 (closer to −Y side) than the drying gas ejecting part 177. The arm drying part 178 is configured such that a drying gas supplied from the aforementioned drying gas source can be ejected obliquely upward from the arm drying part 178, namely toward the nozzle arms 62 at the standby position. Various publicly known mechanisms capable of ejecting gas are applicable as the arm drying part 178.

Figure 15:
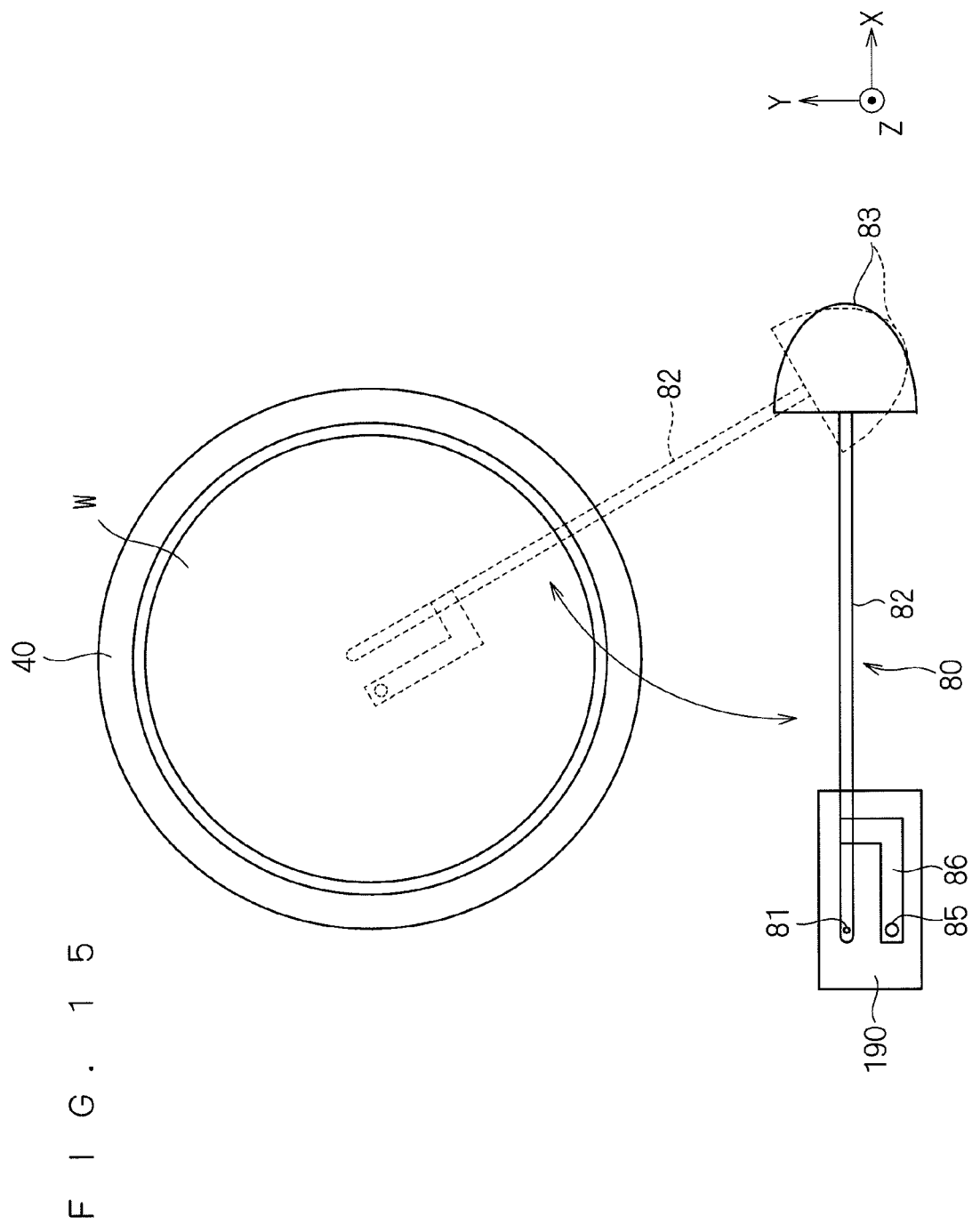
FIG. 15 is a plan view schematically showing the operation of a two-fluid nozzle.
Figure 16:
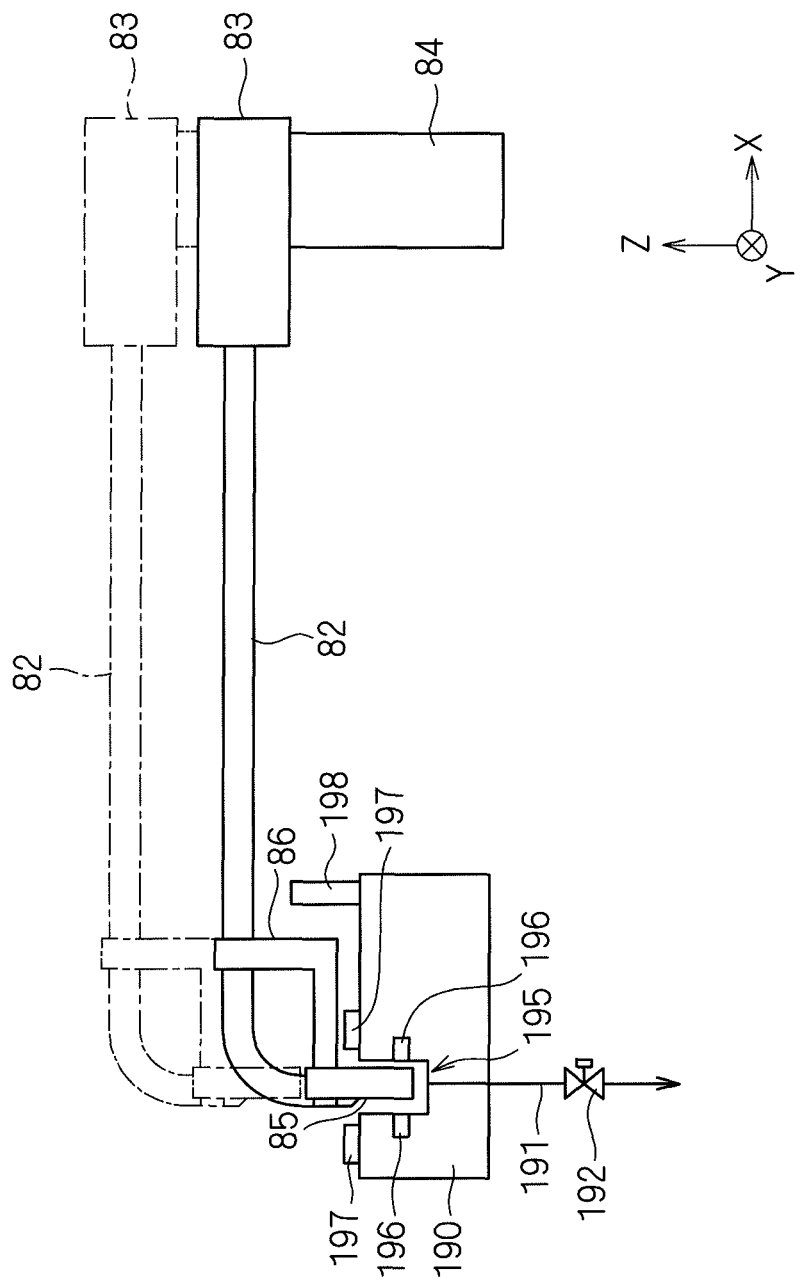
FIG. 16 is a schematic side view of the two-fluid nozzle and a standby pot.

The substrate processing apparatus 1a includes a two-fluid nozzle 80 in addition to the upper processing solution nozzle 60. FIG. 15 is a plan view schematically showing the operation of the two-fluid nozzle 80. FIG. 16 is a schematic side view of the two-fluid nozzle 80 and a standby pot 190. The two-fluid nozzle 80 is a cleaning nozzle that generates droplets by mixing a processing solution such as de-ionized water and pressurized gas, and ejects a mixed fluid of the droplets and the gas to be sprayed onto a substrate W. The two-fluid nozzle 80 has a discharge head 81 attached to the tip end of a nozzle arm 82, and a gas head 85 attached to a support member 86 branching off the nozzle arm 82. The base end of the nozzle arm 82 is coupled to a pivotal driving part 83. The pivotal driving part 83 is provided outside the processing cup 40. The pivotal driving part 83 is capable of making pivotal movement about an axis extending in the vertical direction caused by a pivotal motor (not shown in the drawings) provided therein. The pivotal driving part 83 is capable of causing the nozzle arm 82 to pivot in the horizontal plane (XY plane).

As shown in FIG. 15, the pivotal driving part 83 causes the nozzle arm 82 to pivot in the horizontal plane such that the discharge head 81 moves in an arcuate pattern between a processing position above a substrate W held on the spin chuck 20 and a standby position outside the processing cup 40. The position of the nozzle arm 82 indicated by dotted lines of FIG. 15 is determined when the discharge head 81 is at the processing position. The position of the nozzle arm 82 indicated by solid lines of FIG. 15 is determined when the discharge head 81 is at the standby position. Like in the aforementioned case of the upper processing solution nozzle 60, the pivotal movement of the nozzle arm 82 causing the discharge head 81 to move between the processing position and the standby position is also called the pivotal movement of the nozzle arm 82 between the processing position and the standby position.

As shown in FIG. 16, the base end of the nozzle arm 82 is coupled to the pivotal driving part 83 such that the nozzle arm 82 extends in the horizontal direction from the pivotal driving part 83. The tip end of the nozzle arm 82 extends downward in the pattern of a smooth circular arc. The discharge head 81 through which a processing solution is discharged onto a substrate W held on the spin chuck 20 is attached to the tip end of the nozzle arm 82 extending downward in the vertical direction (in the direction toward −Z side). The discharge head 81 is configured to receive a processing solution (in the third preferred embodiment, de-ionized water) supplied through the inner side of the nozzle arm 82 from a processing solution supplying mechanism provided in a place outside the drawings.

The support member 86 is interposed in the nozzle arm 82. The gas head 85 is attached to the support member 86 such that the gas head 85 and the discharge head 81 are arranged side by side. A pressurized inert gas (in the third preferred embodiment, nitrogen gas) is supplied to the gas head 85. While a processing solution is discharged from the discharge head 81 at the processing position, a pressurized inert gas is ejected from the gas head 85 to mix the inert gas into the processing solution from the discharge head 81, thereby generating droplets of the processing solution. A mixed fluid of the droplets thereby generated and the inert gas is sprayed on the upper surface of a substrate W held on the spin chuck 20. Meanwhile, if the discharge head 81 is at the standby position outside the processing cup 40, the nozzle arm 82 is also on standby outside the processing cup 40 while extending in the X direction (see FIGS. 12 and 15).

The pivotal driving part 83 is attached to an up-and-down driving part 84. An up-and-down motor (not shown in the drawings) provided inside the up-and-down driving part 84 drives the up-and-down driving part 84. In response, the up-and-down driving part 84 causes the pivotal driving part 83, the discharge head 81, the gas head 85, and the nozzle arm 82 to move up and down together in the vertical direction.

The standby pot 190 is placed at the standby position of the discharge head 81. The standby pot 190 has a housing part 195 in the form of a recess. The standby pot 190 houses the discharge head 81 and the gas head 85 of the two-fluid nozzle 80 in the housing part 195 when the discharge head 81 and the gas head 85 are at the standby position. Like the discharge heads 61, the discharge head 81 performs pre-dispensing into the housing part 195 of the standby pot 190 immediately before supplying a processing solution onto a substrate W.

A disposal line 191 is connected to a bottom portion of the housing part 195. A disposal valve 192 is interposed in the disposal line 191. Opening the disposal valve 192 allows drainage of a solution in the housing part 195 to the outside through the disposal line 191.

A cleaning solution ejecting part 196 is provided to the housing part 195 of the standby pot 190. The cleaning solution ejecting part 196 is fixedly placed on a side wall of the housing part 195. The cleaning solution ejecting part 196 is provided with a plurality of ejection holes pointed toward the inner side of the housing part 195. The cleaning solution ejecting part 196 is configured to receive a cleaning solution supplied from a cleaning solution supplying mechanism provided in a place outside the drawings. The cleaning solution supplied from the cleaning solution supplying mechanism is ejected toward the inner side of the housing part 195 through the ejection holes of the cleaning solution ejecting part 196. The cleaning solution ejecting part 196 is not limited to a member with a plurality of ejection holes, but various publicly known mechanisms including a discharge nozzle capable of ejecting a solution are applicable as the cleaning solution ejecting part 196.

A drying gas ejecting part 197 is provided on the upper surface of the standby pot 190 and near an upper opening of the housing part 195. The drying gas ejecting part 197 is provided with a plurality of ejection holes pointed toward the upper opening and its vicinities of the housing part 195 located obliquely downward of the drying gas ejecting part 197. The drying gas ejecting part 197 is configured to receive a drying gas supplied from a drying gas source provided in a place outside the drawings. The drying gas supplied from the drying gas source is ejected toward the upper opening and its vicinities of the housing part 195 through the ejection holes of the drying gas ejecting part 197. The drying gas ejecting part 197 is not limited to a member with a plurality of ejection holes, but various publicly known mechanisms including a gas nozzle capable of ejecting gas are applicable as the drying gas ejecting part 197.

The standby pot 190 further includes an arm drying part 198. The arm drying part 198 is placed on the upper surface of the standby pot 190 and at a position closer to the base end of the nozzle arm 82 (closer to +X side) than the drying gas ejecting part 197. The arm drying part 198 is configured such that a drying gas supplied from the aforementioned drying gas source can be ejected obliquely upward from the arm drying part 198, namely toward the nozzle arm 82 at the standby position. Various publicly known mechanisms capable of ejecting gas are applicable as the arm drying part 198.

The operation of the substrate processing apparatus 1a having the aforementioned structure is described next. Procedure generally taken by the substrate processing apparatus 1a to process a substrate W is the same as that in the first and second preferred embodiments. During surface process of a substrate W by supplying a processing solution to the substrate W, the processing solution scattered from the rotating substrate W is attached to the discharge heads 61 of the upper processing solution nozzle 60. Part of the processing solution may also be attached to the nozzle arms 62 if it is scattered widely. Further, during surface process of a substrate W by using the two-fluid nozzle 80, a scattered processing solution is attached to the discharge head 81 and the gas head 85. If the processing solution attached to the discharge heads 61 and others remains unremoved, it may drop onto the upper surface of a substrate W (such a phenomenon is what is called dripping) when the discharge heads 61 have moved to the processing position. In this case, the processing solution remaining unremoved may become a source of pollution, or it may generate particles after being dried.

In response, in the third preferred embodiment, the discharge heads 61 of the upper processing solution nozzle 60 are cleaned in the following manner. It is preferable that the discharge heads 61 be cleaned each time the discharge heads 61 have moved back from the processing position to the standby position after process of discharging a processing solution onto one substrate W is finished. If the discharge heads 61 are cleaned after process of one substrate W, a processing solution attached to the discharge heads 61 as a result of discharge of the processing solution onto a substrate W will not become a source of pollution during process of a next substrate W.

FIGS. 17 to 20 show procedure of cleaning process of the discharge heads 61 of the upper processing solution nozzle 60. After a substrate W is subjected to the aforementioned process, the pivotal driving part 63 causes the nozzle arms 62 to pivot to move the discharge heads 61 at a stage after the process from the processing position to the standby position outside the processing cup 40. The standby pot 170 is placed at the standby position. So, the discharge heads 61 having moved back to the standby position stop at a position directly above the standby pot 170 as shown in FIG. 17. At a stage immediately after the process, a processing solution scattered from the rotating substrate W during the process remains unremoved on parts of the discharge heads 61 and the nozzle arms 62.

Next, the up-and-down driving part 64 causes the nozzle arms 62 and the discharge heads 61 to move down in the vertical direction to place the discharge heads 61 in the housing part 175 of the standby pot 170. Then, as shown in FIG. 18, a cleaning solution is ejected from the cleaning solution ejecting part 176 of the standby pot 170 toward the discharge heads 61 in the housing part 175, thereby washing away the processing solution attached to the discharge heads 61 during the process.

The cleaning solution ejected from the cleaning solution ejecting part 176 toward the discharge heads 61 falls into the housing part 175 together with the processing solution washed away. Then, the disposal valve 172 is opened to expel the cleaning solution having fallen into the housing part 175 to the outside through the disposal line 171.

Figure 19:
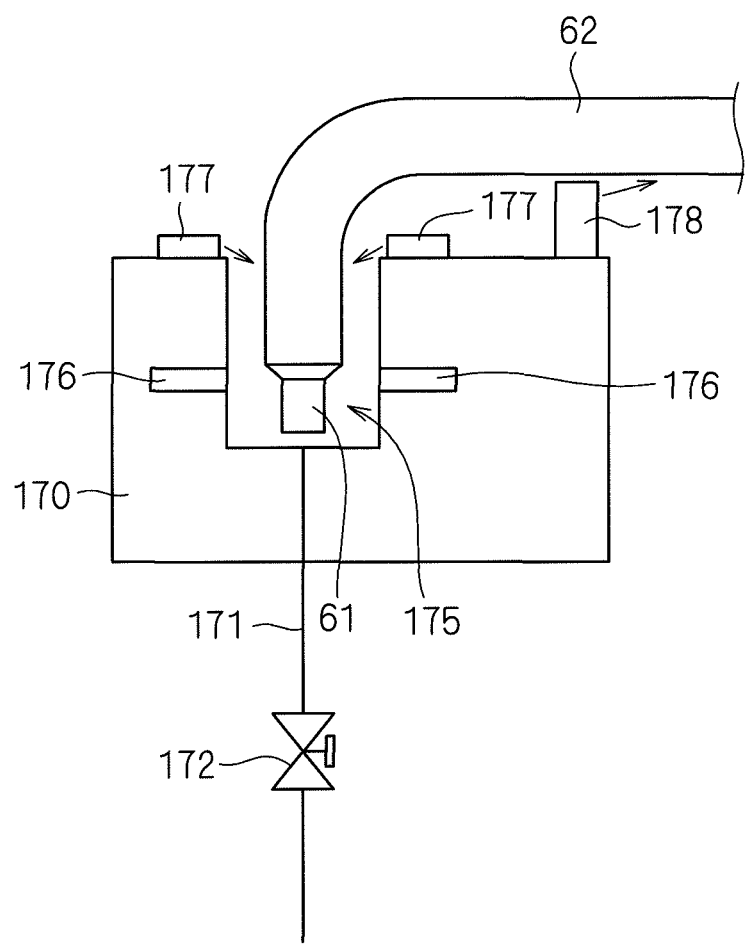

Ejection of the cleaning solution stops after the cleaning solution is ejected for a predetermined period of time from the cleaning solution ejecting part 176. Then, as shown in FIG. 19, a drying gas is ejected from the drying gas ejecting part 177 of the standby pot 170 toward the upper opening and its vicinities of the housing part 175 located obliquely downward of the drying gas ejecting part 177. The drying gas is further ejected from the arm drying part 178 on the upper surface of the standby pot 170 toward the nozzle arms 62.

Figure 20:
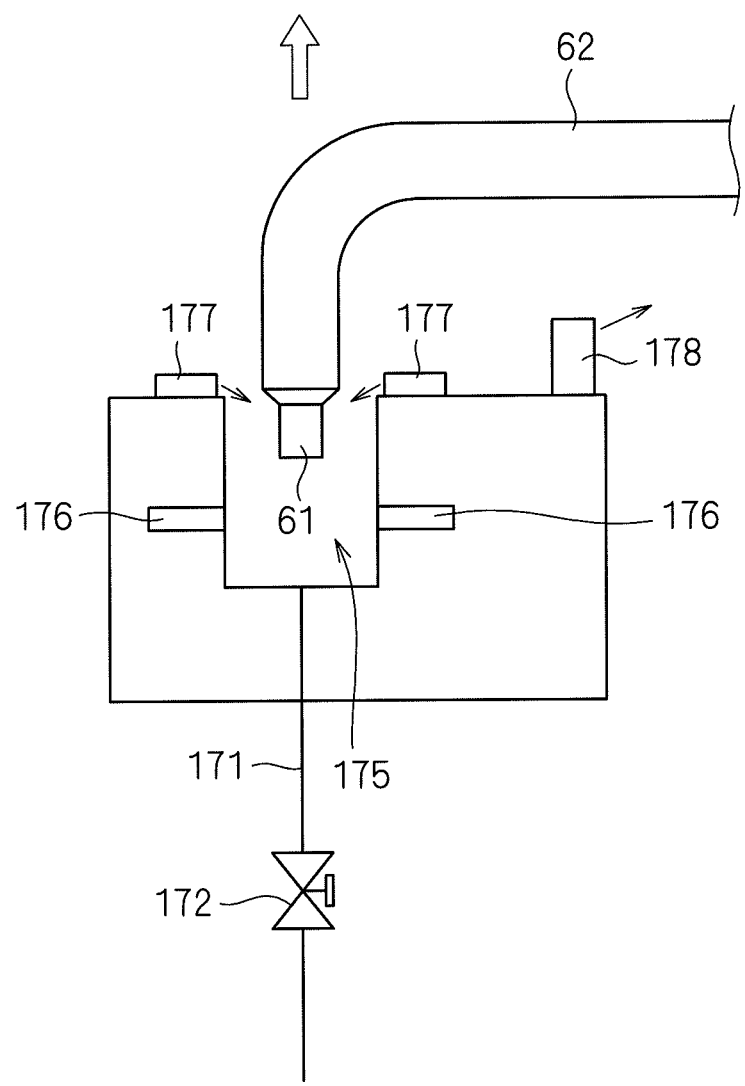

While the drying gas is ejected from the drying gas ejecting part 177 and the arm drying part 178, the up-and-down driving part 64 causes the nozzle arms 62 and the discharge heads 61 to move up gradually in the vertical direction. This lifts the discharge heads 61 out of the housing part 175 of the standby pot 170 while spraying the drying gas ejected from the drying gas ejecting part 177 on the discharge heads 61 being lifted as shown in FIG. 20. The drying gas ejected from the drying gas ejecting part 177 is sprayed on the discharge heads 61 while the discharge heads 61 are lifted, thereby blowing the cleaning solution off the discharge heads 61 to dry the discharge heads 61.

The drying gas ejected from the arm drying part 178 is further sprayed on the nozzle arms 62, thereby removing the processing solution from the nozzle arms 62 to dry the nozzle arms 62.

Lift of the nozzle arms 62 and the discharge heads 61 by the up-and-down driving part 64 stops at a time when the nozzle arms 62 and the discharge heads 61 arrive at a predetermined height. Then, for process of a next substrate W held on the spin chuck 20, the pivotal driving part 63 causes the nozzle arms 62 to pivot to move the cleaned discharge heads 61 from the standby position to the processing position again. The discharge heads 61 perform pre-dispensing into the housing part 175 of the standby pot 170 immediately before starting to move from the standby position.

A processing solution is attached to the discharge head 81 and the gas head 85 of the two-fluid nozzle 80 during surface process of a substrate W by using the two-fluid nozzle 80. So, the discharge head 81 and the gas head 85 are cleaned. The discharge head 81 and the gas head 85 of the two-fluid nozzle 80 are cleaned in substantially the same manner as the discharge heads 61 of the upper processing solution nozzle 60. To be specific, the discharge head 81 and the gas head 85 at a stage after performing process and moving back to the standby position are caused to move down to be placed in the housing part 195 of the standby pot 190. Then, a cleaning solution is ejected from the cleaning solution ejecting part 196 of the standby pot 190 toward the discharge head 81 and the gas head 85, thereby washing away the processing solution attached to the discharge head 81 and the gas head 85 during the process.

Next, ejection of the cleaning solution from the cleaning solution ejecting part 196 stops. Then, a drying gas is ejected from the drying gas ejecting part 197 of the standby pot 190 toward the upper opening and its vicinities of the housing part 195 located obliquely downward of the drying gas ejecting part 197. Next, the discharge head 81 and the gas head 85 are gradually lifted out of the housing part 195 of the standby pot 190. The drying gas ejected from the drying gas ejecting part 197 is sprayed on the discharge head 81 and the gas head 85 being lifted, thereby blowing the cleaning solution off the discharge head 81 and the gas head 85 to dry the discharge head 81 and the gas head 85.

The drying gas is further ejected from the arm drying part 198 on the upper surface of the standby pot 190 toward the nozzle arm 82, thereby removing the processing solution from the nozzle arm 82 to dry the nozzle arm 82.

In the third preferred embodiment, even if a processing solution is attached to the discharge heads 61 of the upper processing solution nozzle 60 during process of a substrate W, a cleaning solution is ejected onto the discharge heads 61 in the standby pot 170, and then a drying gas is ejected from the drying gas ejecting part 177 of the standby pot 170 and sprayed on the discharge heads 61, thereby removing the cleaning solution to dry the discharge heads 61. Thus, the processing solution attached to the discharge heads 61 will not become a source of pollution.

The discharge heads 61 are not only cleaned by spraying a cleaning solution on the discharge heads 61 in the standby pot 170 but are also dried by spraying a drying gas on the discharge heads 61 to blow the cleaning solution off the discharge heads 61 attached thereto during cleaning. So, when the cleaned discharge heads 61 have moved to the processing position, the cleaning solution will not drop onto a substrate W from the discharge heads 61.

Further, the discharge heads 61 are cleaned in the housing part 175 of the standby pot 170 with a cleaning solution ejected from the cleaning solution ejecting part 176. Thus, the cleaning solution will not be scattered to the outside of the standby pot 170, thereby preventing attachment of the cleaning solution to the mechanisms inside the chamber 10 including the spin chuck 20.

Additionally, while the discharge heads 61 are lifted out of the standby pot 170, a drying gas ejected obliquely downward from the drying gas ejecting part 177 is sprayed on the discharge heads 61. This makes it possible to blow a cleaning solution off the discharge heads 61 efficiently in a downward fashion to dry the discharge heads 61.

Further, a drying gas ejected from the arm drying part 178 on the upper surface of the standby pot 170 is sprayed on the nozzle arms 62, thereby removing a processing solution attached to the nozzle arms 62 to dry the nozzle arms 62. This further prevents pollution to be caused by the nozzle arms 62 having received a processing solution.

Additionally, the discharge head 81 and the gas head 85 of the two-fluid nozzle 80 are housed in the standby pot 190, and the discharge head 81 and the gas head 85 are cleaned by spraying a cleaning solution thereon. Then, a drying gas is ejected from the drying gas ejecting part 197, thereby removing the cleaning solution to dry the discharge head 81 and the gas head 85. In this case, the aforementioned effects regarding the discharge heads 61 can also be achieved.

Modifications

The present invention is not limited to the preferred embodiments described above, but various modifications thereof can be made without departing from the substance of the present invention. As an example, the first and second preferred embodiments may be performed simultaneously. More specifically, the drying process of the second preferred embodiment may be performed after process of one substrate W is finished, and the cleaning process of the first preferred embodiment may be performed after process of one lot is finished.

In the first preferred embodiment, the nozzle arms 62 and 82 are entirely cleaned with cleaning solutions ejected from the shower nozzles 71 and 91 longer than the nozzle arms 62 and 82 respectively. However, it is not necessarily required to clean the nozzle arms 62 and 82 entirely, but the nozzle arms 62 and 82 may be cleaned only partially. For partial cleaning of the nozzle arms 62 and 82, parts of the nozzle arms 62 and 82 to face a substrate W held on the spin chuck 20 when the discharge heads 61 and 81 have moved to their processing positions are cleaned reliably. This means that it is required to clean at least parts of the nozzle arms 62 and 82 to face a substrate W held on the spin chuck 20 when the discharge heads 61 and 81 have moved to their processing positions. This prevents processing solutions attached to the nozzle arms 62 and 82 from dropping onto the upper surface of a substrate W when the discharge heads 61 and 81 have moved to the their processing positions.

Further, in the first preferred embodiment, the up-and-down driving part 64 causes the nozzle arms 62 to move up and down such that the nozzle arms 62 cut across jets of a cleaning solution discharged obliquely downward from the shower nozzle 71, thereby cleaning the three nozzle arms 62 with one shower nozzle 71. Meanwhile, a shower nozzle that ejects a cleaning solution at wide angles may be used instead. Use of such a shower nozzle allows cleaning of all the three nozzle arms 62 without the need of causing the nozzle arms 62 to move up and down.

Additionally, shower nozzles may be provided directly above corresponding ones of the three nozzle arms 62 at the standby position. In this case, a cleaning solution is ejected directly downward from these shower nozzles to clean the three nozzle arms 62. This also allows removal of a processing solution attached to the nozzle arms 62 to prevent pollution thereof. However, if the shower nozzle 71 is arranged obliquely upward of the nozzle arms 62 at the standby position as in the first preferred embodiment, the number of shower nozzles 71 can be reduced, and a mist of a cleaning solution generated as a result of spraying of the cleaning solution on the nozzle arms 62 will not be attached to the spin chuck 20.

Further, in the first preferred embodiment, the shower nozzles 71, 91 and the drying gas nozzles 76, 96 perform cleaning and drying processes intended mainly for the nozzle arms 62 and 82. Meanwhile, the shower nozzles 71, 91 and the drying gas nozzles 76, 96 may perform cleaning and drying processes for the discharge heads 61, 81 and the gas head 85 in addition to the nozzle arms 62 and 82. However, like in the third preferred embodiment, it is preferable that the discharge heads 61, 81 and the gas head 85 be cleaned and dried in the standby pots 170 and 190 arranged at the corresponding standby positions.

Still further, in the second preferred embodiment, when the discharge heads 61 have moved back from the processing position to the standby position after process of one substrate W is finished, the nozzle arms 62 arranged obliquely downward of the shower nozzle 71 may be cleaned with a cleaning solution ejected from the shower nozzle 71, and thereafter, the nozzle arms 62 may be dried by spraying with a drying gas ejected from the drying gas nozzles 76. This is also applicable to the two-fluid nozzle 82. To be specific, when the discharge head 81 has moved back from the processing position to the standby position after process of one substrate W is finished, the nozzle arm 82 arranged obliquely downward of the shower nozzle 91 may be cleaned with a cleaning solution ejected from the shower nozzle 91, and thereafter, the nozzle arm 82 may be dried by spraying with a drying gas ejected from the drying gas nozzles 96. If the nozzle arms 62 and 82 are cleaned by ejecting a cleaning solution and thereafter dried by spraying with a drying gas, processing solutions attached to the nozzle arms 62 and 82 during process of a substrate W can be removed reliably. However, if cleaning process realized by ejecting a cleaning solution and drying process realized by ejecting a drying gas are both performed after process of one substrate W is finished, a commensurate period of time is required. This makes an interval longer between process of one substrate W and that of another substrate W, leading to reduction of throughput of the substrate processing apparatus 1. Thus, it is preferable that the nozzle arms 62 and 82 be subjected only to the drying process of the second preferred embodiment in an interval between process of one substrate W and that of another substrate W, and that the nozzle arms 62 and 82 be subjected to both cleaning process realized by ejecting a cleaning solution and drying process realized by ejecting a drying gas between lots as in the first preferred embodiment, for example.

Also, in the second preferred embodiment, all the three nozzle arms 62 are dried by causing the nozzle arms 62 to swing such that the tip ends of the nozzle arms 62 cut across jets of a drying gas discharged from the drying gas nozzles 76. Alternatively, the drying gas nozzles 76 may be arranged at positions opposite the corresponding ones of the three nozzle arms 62 suspended at the standby position. In this case, the drying gas nozzles 76 separately eject a drying gas to dry the corresponding three nozzle arms 62.

Further, in the third preferred embodiment, the discharge heads 61 are cleaned with a cleaning solution ejected from the cleaning solution ejecting part 176 of the standby pot 170 toward the discharge heads 61. Alternatively, a cleaning solution may be supplied and stored in the housing part 175, and the discharge heads 61 may be cleaned by dipping the discharge heads 61 into the stored cleaning solution. Or, the discharge heads 61 may be cleaned with a mist of a cleaning solution supplied into the housing part 175. To be specific, what is required in the third preferred embodiment is that the discharge heads 61 housed in the housing part 175 of the standby pot 170 is cleaned with a cleaning solution supplied to the discharge heads 61.

Additionally, in the third preferred embodiment, the discharge heads 61 are cleaned after process of one substrate W is finished. Alternatively, the discharge heads 61 may be cleaned in an interval between completion of process of one lot and start of process of a next lot. In terms of prevention of pollution caused by a processing solution attached to the discharge heads 61, it is preferable that the discharge heads 61 be cleaned after process of one substrate W is finished. Meanwhile, cleaning the discharge heads 61 between lots is more advantageous in terms of increase of throughput.

Further, a substrate to be processed by the substrate processing apparatuses 1 and 1*a* is not limited to a semiconductor substrate, but it may also be a glass substrate used in a flat-panel display such as a liquid crystal display.

While the invention has been shown and described in detail, the foregoing description is in all aspects illustrative and not restrictive. It is therefore understood that numerous modifications and variations can be devised without departing from the scope of the invention.

What is claimed is:

1. A substrate processing method that supplies a processing solution to a substrate, comprising the steps of
   (a) causing a plurality of nozzle arms to pivot such that a discharge head arranged at the tip end thereof moves between a processing position and a standby position, the discharge head discharging a processing solution to a substrate held on a substrate holding element in a substantially horizontal position while being caused to rotate by the substrate holding element, the processing position being above a substrate held on said substrate holding element, the standby position being outside a cup surrounding said substrate holding element, said plurality of nozzle arms being arranged in parallel to each other in a horizontal direction, and
   (b) cleaning at least part of said plurality of nozzle arms that are to face a substrate held on said substrate holding element when said discharge head has moved to said processing position, wherein
   in said step (b), while a cleaning solution is ejected obliquely downward from a shower nozzle when said discharge head is at said standby position, said plurality of nozzle arms are caused to move up and down such that said plurality of nozzle arms cut across a jet of the cleaning solution discharged from said shower nozzle, and thereby, the cleaning solution is sprayed on all of said plurality of nozzle arms in order.

2. The substrate processing method according to claim 1, wherein said shower nozzle ejects a cleaning solution in a direction away from said substrate holding element.

3. The substrate processing method according to claim 1, further comprising the step of
   (c) ejecting a drying gas to be sprayed on at least part of said plurality of nozzle arms having received a cleaning solution ejected from said shower nozzle to dry this part of said plurality of nozzle arms.

4. The substrate processing method according to claim 3, wherein in said step (c), a drying gas is sprayed first on the tip end of said plurality of nozzle arms when said discharge head is at said standby position.

\* \* \* \* \*